(12) United States Patent
Kido et al.

(10) Patent No.: US 9,203,046 B2
(45) Date of Patent: Dec. 1, 2015

(54) ORGANIC ELECTROLUMINESCENT DEVICE AND PRODUCTION PROCESS THEREOF

(75) Inventors: Junji Kido, Yonezawa (JP); Toshio Matsumoto, Fujisawa (JP); Takeshi Nakada, Fujisawa (JP); Norifumi Kawamura, Fujisawa (JP)

(73) Assignees: Junji Kido, Yonezawa-shi, Yamagata-ken (JP); ROHM Co., Ltd., Kyoto (JP)

( * ) Notice: Subject to any disclaimer, the term of this patent is extended or adjusted under 35 U.S.C. 154(b) by 0 days.

(21) Appl. No.: 10/966,708

(22) Filed: Oct. 15, 2004

(65) Prior Publication Data

US 2005/0084713 A1    Apr. 21, 2005

(30) Foreign Application Priority Data

Oct. 17, 2003   (JP) .................................. 2003-358401

(51) Int. Cl.
   *H01L 51/50*   (2006.01)
   *H01L 51/00*   (2006.01)
   *H01L 51/52*   (2006.01)

(52) U.S. Cl.
   CPC ........ *H01L 51/5048* (2013.01); *H01L 51/5092* (2013.01); *H01L 51/002* (2013.01); *H01L 51/0052* (2013.01); *H01L 51/0059* (2013.01); *H01L 51/0077* (2013.01); *H01L 51/0081* (2013.01); *H01L 51/5221* (2013.01); *Y10T 428/26* (2015.01)

(58) Field of Classification Search
   None
   See application file for complete search history.

(56) References Cited

U.S. PATENT DOCUMENTS

| 4,356,429 A | 10/1982 | Tang ............................ 313/503 |
| 4,539,507 A | 9/1985 | VanSlyke et al. ............. 313/504 |

(Continued)

FOREIGN PATENT DOCUMENTS

| CN | 1190322 A | 8/1998 |
| CN | 1261760 A | 8/2000 |

(Continued)

OTHER PUBLICATIONS

Machine-assisted translation of JP 2000-182774.*

(Continued)

*Primary Examiner* — Marie R. Yamnitzky
(74) *Attorney, Agent, or Firm* — McCormick, Paulding & Huber LLP

(57) ABSTRACT

An organic electroluminescent device including a substrate, the substrate includes, laminated thereon, an anode layer; an organic structure including at least one light-emissive layer or at least one light-emissive unit having at least one light-emissive layer; a low resistance electron-transporting layer including a mixed layer of an electron-donating metal dopant and an organic compound; an organometallic complex-contained layer including an organometallic complex compound containing at least one metal ion selected from the group having an alkaline metal ion, an alkaline earth metal ion and a rare earth metal ion; a reducing reaction generating layer; and a cathode layer, in that order. At least one of the anode layer and the cathode layer is transparent. The reducing reaction generating layer is a layer produced by depositing on the organometallic complex-contained layer a thermally reducible metal capable of reducing a metal ion in the organometallic complex compound in a vacuum to the corresponding metal, followed by causing an oxidation-reduction reaction therebetween.

14 Claims, 17 Drawing Sheets

(56) References Cited

U.S. PATENT DOCUMENTS

| | | | | |
|---|---|---|---|---|
| 4,720,432 | A | 1/1988 | VanSlyke et al. | 428/457 |
| 4,885,211 | A | 12/1989 | Tang et al. | 428/457 |
| 5,059,862 | A | 10/1991 | VanSlyke et al. | 313/503 |
| 5,247,190 | A | 9/1993 | Friend et al. | 257/40 |
| 5,458,977 | A | 10/1995 | Hosokawa et al. | 428/411.1 |
| 5,703,436 | A * | 12/1997 | Forrest et al. | 313/506 |
| 5,719,467 | A | 2/1998 | Antoniadis et al. | 313/506 |
| 5,891,554 | A | 4/1999 | Hosokawa et al. | 428/212 |
| 5,909,081 | A | 6/1999 | Eida et al. | 313/504 |
| 5,981,092 | A | 11/1999 | Arai et al. | 428/690 |
| 5,989,737 | A | 11/1999 | Xie et al. | 428/690 |
| 6,013,384 | A | 1/2000 | Kido et al. | 428/690 |
| 6,028,327 | A | 2/2000 | Mizoguchi et al. | 257/98 |
| 6,396,209 | B1 | 5/2002 | Kido et al. | |
| 6,423,429 | B2 | 7/2002 | Kido et al. | 428/690 |
| 6,589,673 | B1 | 7/2003 | Kido et al. | 428/690 |
| 2002/0045061 | A1* | 4/2002 | Hosokawa | 428/690 |
| 2003/0044645 | A1* | 3/2003 | Kambe et al. | 428/690 |
| 2003/0189401 | A1 | 10/2003 | Kido et al. | |

FOREIGN PATENT DOCUMENTS

| | | |
|---|---|---|
| CN | 1447629 A | 10/2003 |
| EP | 0 616 488 A2 | 9/1994 |
| EP | 0373582 B1 | 3/1995 |
| EP | 0388768 B1 | 8/1995 |
| EP | 0 855 848 A2 | 7/1998 |
| EP | 0 948 063 A2 | 10/1999 |
| EP | 1 017 118 A2 | 7/2000 |
| EP | 1 089 597 A1 | 4/2001 |
| EP | 1 351 558 A1 | 10/2003 |
| JP | 59-194393 | 11/1984 |
| JP | 63-295695 | 12/1988 |
| JP | 2-88689 | 3/1990 |
| JP | 2-191694 | 7/1990 |
| JP | 2-196885 | 8/1990 |
| JP | 2-250292 | 10/1990 |
| JP | 2-252793 | 10/1990 |
| JP | 2-255789 | 10/1990 |
| JP | 2-289676 | 11/1990 |
| JP | 3-231970 | 10/1991 |
| JP | 3-296595 | 12/1991 |
| JP | 4-96990 | 3/1992 |
| JP | 04 137485 | 5/1992 |
| JP | 04 328295 | 11/1992 |
| JP | 5-9470 | 1/1993 |
| JP | 5-17764 | 1/1993 |
| JP | 5-202011 | 8/1993 |
| JP | 05 331458 | 12/1993 |
| JP | 6-25659 | 2/1994 |
| JP | 6-49079 | 2/1994 |
| JP | 6-88072 | 3/1994 |
| JP | 6-100857 | 4/1994 |
| JP | 6-107648 | 4/1994 |
| JP | 6-92947 | 5/1994 |
| JP | 6-132080 | 5/1994 |
| JP | 6-145146 | 5/1994 |
| JP | 6-203963 | 7/1994 |
| JP | 6-206865 | 7/1994 |
| JP | 6-207170 | 7/1994 |
| JP | 6-215874 | 8/1994 |
| JP | 6-279322 | 10/1994 |
| JP | 6-279323 | 10/1994 |
| JP | 6-293778 | 10/1994 |
| JP | 7-97355 | 4/1995 |
| JP | 7-101911 | 4/1995 |
| JP | 7-126225 | 5/1995 |
| JP | 7-126226 | 5/1995 |
| JP | 7-145116 | 6/1995 |
| JP | 7-157473 | 6/1995 |
| JP | 7-179394 | 7/1995 |
| JP | 7-188130 | 7/1995 |
| JP | 7-228579 | 8/1995 |
| JP | 7-244012 | 9/1995 |
| JP | 7-278124 | 10/1995 |
| JP | 8-22557 | 1/1996 |
| JP | 8-40995 | 2/1996 |
| JP | 8-40996 | 2/1996 |
| JP | 8-40997 | 2/1996 |
| JP | 8-48656 | 2/1996 |
| JP | 8-81472 | 3/1996 |
| JP | 09272865 | 10/1997 |
| JP | 10 050480 | 2/1998 |
| JP | 10-270171 | 10/1998 |
| JP | 11-233262 | 8/1999 |
| JP | 11-251067 | 9/1999 |
| JP | 2000-182774 | 6/2000 |
| JP | 2001-102175 | 4/2001 |
| JP | 2001-142627 | 5/2001 |
| JP | 2001-244079 | 9/2001 |
| JP | 2002-86599 | 3/2002 |
| JP | 2002-332567 | 11/2002 |
| JP | 2003-272860 | 9/2003 |

OTHER PUBLICATIONS

Synthetic Metals, (2002), vol. 128, pp. 211-214.*
Heithecker et al., Applied Physics Letters, (2003), vol. 82, No. 23, pp. 4178-4180.*
Parthasarathy et al., Journal of Applied Physics, (2001), vol. 89, No. 9, pp. 4986-4992.*
First Office Action and English Translation for Chinese Application No. 2004100804504.5 dated Mar. 7, 2008.
"Organic electroluminescent diodes" C. W. Tang and S. A. VanSlyke, Appln. Phys. Lett. 51 (Sep. 21, 1987)., pp. 913- 915.
CRC Handbook of Chemistry & Physics, $64^{th}$ Ed; pp. E76-E77 (1984).
Toppan Printing Co. (cf. $51^{st}$. Periodical Meeting, Japanese Society of Applied Physics, Preprint 28a-PB-4 p. 1040.
Pioneer Co. (cf. $54^{th}$ Periodical Meeting, Japanese Society of Applied Physics, Preprint 29p-ZC-15 p. 1127).
"Bright Organic Electroluminescent Devices with Double-Layer Cathode", J. Kido, et al., IEEE Transactions on Electron Devices, vol. 40, No. 7, Jul. 1993, pp. 1342-1344.
"Bright organic electroluminescent devices having a metal-doped electron-injecting layer", J. Kido, et al., Applied Physics Letters, vol. 73, Nov. 1998, No. 20, pp. 2866-2868.
The $10^{th}$ International Workshop in Inorganic and Organic Electroluminescense (EL '00), Dec. 2000, pp. 297-300.
"Organic Electroluminescent Devices Having Metal Complexes as Cathode Interface Layer", J. Endo, et al., Jpn. J. Appln. Phys. vol. 41 (2002), pp. L800-L803.
"Organic Electroluminescent Devices Using Metal Complexes as an Electron Injection Layer", Endo et al., p. 1086; 16-a-YH-10 (1998).
"Thick Organic Electroluminescent Devices having Metal-Doped Electron-Injecting Layer", preprint 4p-N-6, p. 1079. (1999).
European Search Report for SN EP 04 02 4611 dated Mar. 3, 2006.
"Organic EL Devices Doped With a Quinacridone Derivative Showing Higher Brightness and Luminescent Efficiency", 29P-ZC-15; Pioneer Electronic Corp., Corporate R&D Lab., Murayama, et al.
"High Bright Organic Thin Film EL Devices Using a Li Alloy Cathode", 28a-PB-4, Toppan Printing Co., Ltd., Y Itoh, et al.
"A Calcium Oxide Can be Reduced by Aluminum", Chemical Handbook, p. 369.
Metal Handbook p. 88.
Metal Handbook p. 87.
"Polymer Light-Emitting Electrochemical Cells", (Science vol. 269, Aug. 25, 1995 p. 1086-1089) by Q. Pei, et al.
Physical Review Letters (vol. 14, No. 7) dated Feb. 15, 1965, p. 228-231.
IEEE Transactions on Electron Devices, "Bright Organic Electroluminescent Devices with Double-Layer Cathode", (vol. 40, No. 7) dated Jul. 1993, pp. 1342-1344.
Society for Information Display International Symposium Digest of Technical Papers (vol. XXVIII), May 13-18, 1997 pp. 775-777.
"Organic EL Cells Using Alkaline Metal Compounds as Electron Injection Materials", by T. Wakimoto, Y. Fukuda, K. Nagayama, A. Yokoi, H. Nakada, and M. Tsuchida, vol. 44, No. 8, dated Aug. 1997, pp. 1245-1248.

(56) References Cited

OTHER PUBLICATIONS

"Electroluminescence from Polyvinylcarbazole films: 1. Carbazole cations", Partridge, R.H., Polymer, Jun. 1983, vol. 24, pp. 733-738.
"Electroluminescence from Polyvinylcarbazole films: 2. Polyvinylcarbazole films containing antimony pentachloride" Partridge, R.H., Polymer, Jun. 1983, vol. 24, pp. 739-747.
"Electroluminescence from Polyvinylcarbazole films: 3. Electroluminescent devices" Partridge, R.H., Polymer, Jun. 1983, vol. 24, pp. 748-754.
"Electroluminescence from Polyvinylcarbazole films: 4. Electroluminescence using higher work function cathodes" Partridge, R.H., Polymer, Jun. 1983, vol. 24, pp. 755-762.
"Effects of microcavities on the spontaneous emission of organic light-emitting diodes with ZnO:Al as the anode" J. Phys.: Condensed Matter, L. Zugang, et al., 1998, vol. 10, pp. 6019-6025.
"Interference effects in bilayer organic light-emitting diodes", Applied Physics Letters, S. K. So, et al., Apr. 5, 1999, vol. 74, No. 14, pp. 1939-1941.

"Vertical-Cavity Organic Light-Emitting Diode Display", IBM Technical Disclosure Bulletin, Sep. 1997, vol. 40, No. 09, pp. 165-167.
"Polymer light-emitting diodes placed in microcavities", Synthetic Metals 76, M. Berggren, et al., 1996, pp. 121-123.
"29.1: Invited Paper: Bright Organic EL Devices Having Metal-Doped Electron-Injecting Layer", SID 97 Digest, Kido, J. and Matsumoto, T., pp. 775-777. (1997).
"The Production of Metallic Calcium by Thermal Reduction", C.C. Loomis, pp. 207-216 (1946).
"A Lithium Carboxylate Ultrathin Film on an Aluminum Cathode for Enhanced Electron Injection in Organic Electroluminescent Devices". C. Ganzorig and M. Fujihira, Jpn. J. Appl. Phys. vol. 38 (1999), pp. L1348-L1350.
"Interface engineering in organic electroluminescent devices", L. S. Hung and M. G. Mason, Proceedings of the 10$^{th}$ International Workshop on Inorganic and Organic Electroluminescence (EL '00), pp. 47-56 (2000).

* cited by examiner

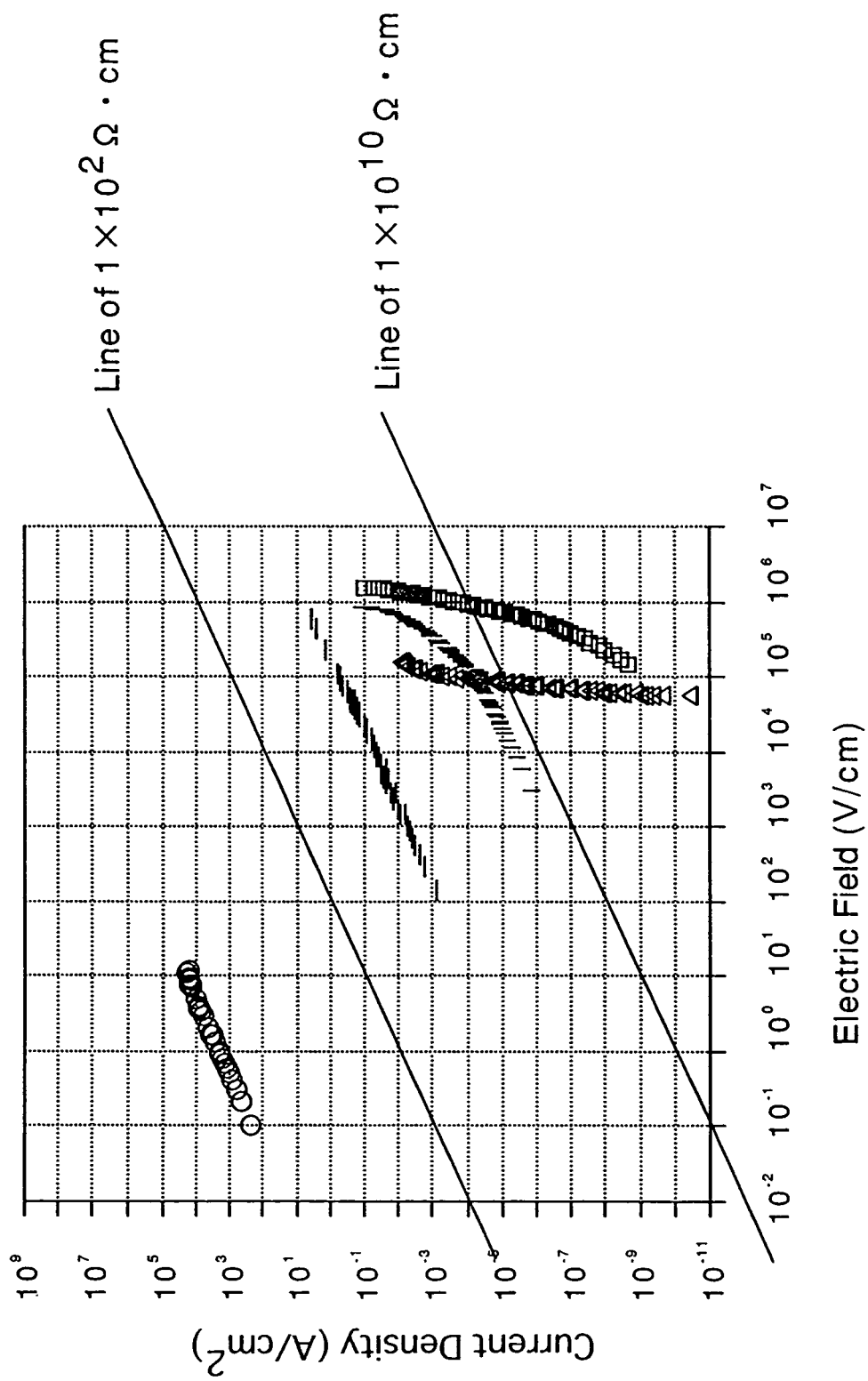

ORGANIC ELECTROLUMINESCENT DEVICE AND PRODUCTION PROCESS THEREOF

CROSS REFERENCE TO RELATED APPLICATION

The present application is related to and claims priority of the following priority application, namely, Japanese patent application number 2003-358401 filed on Oct. 17, 2003 and incorporates by reference said priority application herein.

BACKGROUND OF THE INVENTION

1. Field of the Invention

The present invention relates to an organic electroluminescent device (hereinafter, abbreviated as an "organic EL device") which can be used as a planar light source or as a display device. Particularly, the present invention relates to an electron injection layer and an electron transporting layer which are contained in the EL device to smoothly introduce electrons from a cathode to an organic structure having a light-emissive or luminescent layer.

2. Description of the Related Art

Attention has been made to an organic electroluminescent device in which a light-emissive layer is constituted from an organic compound, because such a device can ensure a large area display at a low driving voltage. To highly increase the efficiency of the organic EL devices, Tang et al. of Eastman Kodak Company, as is disclosed in Appl. Phys. Lett., 51, 913 (1987), have successfully achieved an EL device which can exhibit a high luminance and sufficient efficiency during practical use, i.e., a luminance of 1,000 cd/m$^2$ and an external quantum efficiency of 1% at an applied voltage of not more than 10 volts, when the EL device produced has a structure in which organic compound layers having different carrier transporting properties are laminated to thereby introduce holes and electrons with a good balance from an anode and a cathode, respectively, and the thickness of the organic compound layers is controlled to be not more than 2,000 Å (1 Å=10$^{-10}$ m).

Furthermore, it has been already acknowledged in the development of high efficiency EL devices that the technology for introducing electrons from a cathode layer and holes from an anode layer into an organic layer of the devices without an energy barrier are important.

In Tang et al., described above, to reduce an energy barrier which can cause a problem when electrons are introduced from a metal electrode to an organic compound which is generally considered to be an electrically insulating material, magnesium (Mg) having a low work function (3.6 eV; 1 eV=1.60218×10$^{-19}$ J) is used. The work function referred to herein is based on the data described in CRC Handbook of Chemistry and Physics, 64$^{th}$ Edition. However, since magnesium is liable to be oxidized and instable and also has poor adhesion to the surface of the organic material, Tang et al. have suggested to use magnesium as an alloy thereof with silver (Ag: work function of 4.6 eV), since silver is relatively stable, and has a high work function and good adhesion to the surface of the organic material. Magnesium and silver are co-deposited to form an alloy thereof. Reference should be made to the Kodak patents concerning the organic EL devices, because the progress until Tang et al. developed the use of a magnesium alloy is described in detail therein.

Referring to Kodak patents, the initially issued Kodak patents such as U.S. Pat. Nos. 4,356,429 and 4,539,507 teach that the low work function metal useful as a cathode material of the organic EL devices includes Al, In, Ag, Sn, Pb, Mg, Mn, and the like. Namely, the low work function metal is not defined with reference to its work function values in these patents. Afterward issued Kodak patents such as U.S. Pat. Nos. 4,885,211, 4,720,432 and 5,059,862 teach that the required driving voltage can be lowered with reduction of the work function of the metal used in the cathode. Moreover, it is also disclosed that the low work function metal is defined as a metal having a work function of less than 4.0 eV and a metal having a work function greater than 4.0 eV can be used as being mixed with a metal having a work function of less than 4.0 eV, which is chemically instable, to form an alloy, thereby giving a chemical stability to the resulting alloyed cathode. The stabilizing metal is referred to as a higher work function second metal, and candidate examples thereof include Al, Ag, Sn and Pb which are described as the low work function metal in the above-cited initial Kodak patents. The inconsistencies in the disclosures between the initial and later patents show that the Kodak patents have invented as a result of repeated trial and error at the initial stage of development. Furthermore, in the Kodak patents described above, it is disclosed that the alkaline metals having the lowest work function should be removed from the candidate examples of the cathode metal, even though they have the potential to exhibit excellent functions in principle, because they have an excessively high reactivity for the stable driving of the devices.

On the other hand, a group of researchers of Toppan Printing Co. (cf. 51st periodical meeting, Japanese Society of Applied Physics, Preprint 28a-PB-4, p. 1040) and a group of researchers of Pioneer Co. (cf. 54th periodical meeting, Japanese Society of Applied Physics, Preprint 29p-ZC-15, p. 1127) have discovered that if lithium (Li), which is an alkaline metal and has a lower work function than that of Mg, and was excluded from the claims of the Kodak patents, is used and is alloyed with aluminum (Al: work function: 4.2 eV) to form a stabilized electron injection cathode, a lower driving voltage and a higher luminance in comparison with those of the EL device using the Mg alloy can be obtained. Furthermore, as is reported in IEEE Trans. Electron Devices, 40, 1342 (1993), the inventors of the present invention have found that a two-layered cathode produced by depositing lithium (Li) alone at a very small thickness of about 10 Å on an organic compound layer, followed by laminating silver (Ag) onto the deposited Li layer, is effective to attain a low driving voltage in EL devices.

In addition, recently, the inventors of the present invention have successfully found, as is reported in Appl. Phys. Lett., 73 (1998) 2866, "SID97DIGEST, p. 775", Japanese Unexamined Patent Publication (Kokai) No. 10-270171 and the US counterpart thereof, U.S. Pat. No. 6,013,384, that in EL devices, if an alkaline metal such as lithium, an alkaline earth metal such as strontium and transition metals including a rare earth metal such as samarium are doped into an organic layer adjacent to the cathode in place of doping the same into the cathode metal, a driving voltage can be reduced. This is considered to be because an organic molecule in the organic layer adjacent to the electrode is changed to the corresponding radical anion as a result of metal doping, thus largely reducing a energy barrier for the electron injection from the electrode. In such a case, even if a high work function metal having a work function greater than 4.0 eV such as aluminum is used as the cathode metal, it becomes possible to reduce a driving voltage in EL devices, and also it has been confirmed as disclosed in Japanese Unexamined Patent Publication (Kokai) No. 2002-332567 that, even when ITO and other high work function and transparent electrode materials which are conventionally used as an anode material and were considered not to be suitable as the cathode material, are used as a cathode material, the device can work as a light emitting device.

Moreover, the inventors of the present invention have proposed organic EL devices in Japanese Unexamined Patent Publication (Kokai) Nos. 11-233262 and 2000-182774. These EL devices are characterized in that an organic layer in a portion adjacent to the cathode electrode is formed from an organometallic complex compound containing at least one metal ion selected from the group having an alkaline metal ion, an alkaline earth metal ion and a rare earth metal ion, or is formed from a mixed layer of the organometallic complex compound and an electron-transporting organic compound and the cathode electrode is formed from the electrode material including a thermally reducible metal capable of reducing an alkaline metal ion, an alkaline earth metal ion and a rare earth metal ion, contained in the organometallic complex compound, in vacuum to the corresponding metal (cf. The 10$^{th}$ International Workshop on Inorganic and Organic electroluminescence; p. 61, Jpn. J. Appl., Vol. 41 (2002) pp. L800-L803; Japan Society of Applied Physics, 59$^{th}$ Autumn Meet., 1998, Ext. Abstr., p. 1086).

In the electron injection layer having the above structure, during vapor deposition of the thermally reducible metals such as aluminum and zirconium under a vacuum, the thermally reducible metals in the atomized state, i.e., in highly reactive condition, can come down to the organometallic complex compound, thereby reducing and liberating metal ions in the complex compound. Furthermore, the reduced and liberated metals are being doped, in-situ, into the electron-transporting organic compound layer and reduce the electron-transporting organic compound (the reduction caused herein means the reduction defined by Lewis and thus acceptance of electrons). Accordingly, as in the above-described direct metal doping process, the electron-transporting organic compounds can be changed to radical anions. Namely, according to this method, aluminum is selected not by its level of the work function as in the conventional methods, but by the thermally reducible ability under vacuum conditions. Furthermore, it is also important aspect that all these thermally reducible metals like aluminum (4.02 eV), silicon (4.08 eV), zirconium (4.005 eV), titanium (4.033 eV) and tungsten (4.5 eV) have a work function greater than 4.00 eV, thereby resulting in chemically stable cathode metals.

As can be appreciated from the above-described historical descriptions of the electron injection technologies, in the development of organic EL devices, there have been persistent attempts to improve the electron injection electrodes and improve the method of forming an electron injection layer in the cathode interface. As a result, the emission efficiency of the EL devices could be drastically improved and also it became possible to drive the devices at a lower voltage. Accordingly, at present, the above electron injection-related factors have been recognized to be important technologies for improving the properties of the devices in the production of the organic EL devices.

However, an alloy-made electrode having Mg and Li still suffers from the drawback of the EL device applied thereto deteriorating due to oxidation of the electrodes, and the electrode material used has to be selected in view of the resulting characteristics of electron injection to the organic compound layer as well as the resulting function as the wiring material. Namely, there are limitations in selecting the electrode material for the alloy-based electrode.

The two-layered cathode suggested by the inventors of the present invention cannot act as a cathode when the Li layer has a layer thickness of not less than 20 Å (cf. IEEE Trans. Electron Devices, 40, 1342 (1993)). Further, when the Li layer is vapor deposited at a very small thickness of about 10 Å, it is difficult to control the thickness of the resulting Li layer, thereby causing problems with reproducibility of the EL devices.

Furthermore, in the metal doping method suggested by the inventors of the present invention in which a metal is doped in an organic layer in a portion adjacent to the cathode metal, the selection of the combination of the electron-transporting organic compound used and the doping metal is important, and an appropriate selected combination is characterized in that an increase of the driving voltage being able to be prevented even if a thickness of the doping layer is increased to an unexpectedly large size (larger than expected by a person skilled in the art) such as 2,000 Å or more (cf. Japanese Unexamined Patent Publication (Kokai) No. 2001-102175, and 60th Autumn Meeting, Society of Applied Physics, Preprint 4p-N-6, p. 1079). Therefore, the layer produced by this metal doping method is believed to be the most effective electron injection and transporting layer among the layers produced by the prior art methods. However, as a result of their studies so far, the inventors of the present invention have been concerned with the problem of when a metal having a thermal reduction property such as aluminum and zirconium is used as a metal material for the cathode, the doped metal (alkaline metal, in this case) atoms, which have been already changed to the corresponding cations (i.e., the metal atoms are in the oxidized state. By contrast, the electron-transporting organic compounds are in the reduced, radical anionized state.) and thus are being in a chemically stable state, can be reduced again to the original metal state, and thus active liberated metals can be generated in an interface with the cathode. Namely, because the doped metal (like alkaline metal) has a highly reactive property as described above, when the doped metal is liberated and being in a metal state (not in an oxidized state) in an interface with the cathode, it can rapidly react with oxygen and water in an atmosphere, as in the case of using the alloy-based electrode described above, to thereby cause deterioration in the stability of the resulting EL device.

The above reaction process can be explained as follows.

When the organic layer is doped with a reactive metal such as alkaline metals and others, the resulting doping state is represented by the following formula.

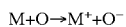

M+O→M$^+$+O$^-$

Namely, a metal atom M, typically an alkaline metal, is doped with an organic molecule O to form a charge transfer complex (hereinafter referred to as a C-T complex) (cf. Appl. Phys. Lett., 73 (1998) 2867 cited above). When the organic layer is in the form of this C-T complex, if a thermally reducible metal, typically aluminum (Al), is vapor deposited on the C-T complex layer, it is expected that the following reaction is caused because of the reducing power of the aluminum in vacuum.

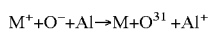

M$^+$+O$^-$+Al→M+O$^{31}$+Al$^+$

The resulting state (M+O$^-$+Al$^+$) after the reaction is stable in vacuum, however, under atmospheric condition, the metal M such as an alkaline metal is in a highly reactive state, i.e., the metal M is a liberated active metal. The liberated active metal can deteriorate the stability of the resulting EL device and the inventors of the present invention have found through their studies that the active metal can also cause some reduction of the quantum efficiency (current efficiency) of the resulting EL device.

When an organic layer in the portion adjacent to the cathode electrode is formed from an organometallic complex compound containing at least one metal ion selected from the group having an alkaline metal ion, an alkaline earth metal ion and a rare earth metal ion, or is formed from a mixed layer of the organometallic complex compound and an electron-transporting organic compound, and the cathode electrode is formed from an electrode material having a thermally reducible metal such as aluminum so that an alkaline metal ion, an alkaline earth metal ion and a rare earth metal ion, contained in the organometallic complex compound, is reduced in vacuum to the corresponding metal (cf. Japanese Kokai Nos. 11-233262 and 2000-182774; 10th International Workshop on Inorganic and Organic electroluminescence, p. 61; Jpn. J. Appl., Vol. 41 (2002) pp. L800-L803; Japan Society of Applied Physics, 59th Autumn Meet., 1998, Ext. Abstr., p. 1086, described above), the layer thickness as well as the doped metal concentration of the in-situ generated metal-doped layer (by the thermal reduction reaction) can not be regulated intentionally so that this type of layer can not meet the requirements for the layer thickness to increase unlimitedly without any undesirable voltage increase and for the layer to function as a low resistance electron transporting layer as is realized in the direct metal doping method.

SUMMARY OF THE INVENTION

The present invention is devised in view of the above-described problems of the prior art organic EL devices. The present invention achieves a low driving voltage in the organic EL devices regardless of the work function of the cathode material by lowering an energy barrier in the electron injection from the cathode to the organic compound layer.

Furthermore, the present invention also provides an organic EL device capable of achieving more stable device properties in both the driving stage and the storage stage in comparison with the prior art EL devices having the cathode electrode formed from the above-described low work function metal, even if the cathode electrode was formed from any one of the cheap and chemically stable metals, for example, aluminum, which are conventionally used as the wiring material in the prior art production of semiconductor devices, and also such a cathode material is used as a sole metal, in place of being used as a metal alloy. Note, it is well-known to a person skilled in the art that when a high work function metal having a work function greater than 4.0 eV such as aluminum is solely used or an aluminum-containing metal alloy essentially having metals having a high work function is used as the cathode material, a driving voltage can be increased in the resulting EL device, and also a driving stability of the EL device can be lowered (cf. Appl. Phys. Lett., 51, 913 (1987) and Kodak patents, cited above).

Furthermore, the present invention provides an organic EL device which can exhibit an excellent driving stability in comparison with the prior art EL devices, by excluding, from a layer adjacent to the cathode, any reactive metals which is being liberated as a metal state such as alkaline metals, alkaline earth metals and rare earth metals, and in place of this exclusion, making the same reactive metals a stable and oxidized state (cation state) in the vicinity of the cathode. More specifically describing, one of the object of this invention is to avoid the problem (described above) being caused when the undesirable thermal reduction reaction occurs, by disposing the metal-doping layer apart from the cathode layer by inserting a thermal reducing reaction generating layer in-between, and to make the metal-doping layer play a role just as a low resistance electron-transporting layer, not as an electron-injection layer (that should be adjacent to the cathode). Namely, since the metal doping layer can exhibit a characteristic resistivity ($\Omega$cm) which is a negligibly (or extraordinarily) lower value than the resistivity of each of the (undoped) organic layers between the electrodes, it becomes possible to drive the EL devices having the metal doping layer at a larger thickness of more than 2,000 Å without increasing a driving voltage of the devices, although it was commonly acknowledged in a person skilled in the art that such a large value of the total thickness between electrodes can not be employed to the organic EL device because it was believed that the driving voltage can increase inevitably due to the increase of the thickness. Furthermore, the metal doping method can result in such advantages that the metal doping layer can prevent a risk of short circuiting between the electrodes and also can be utilized as a layer of controlling a profile of the spectrum (cf. Japanese Kokai No. 2001-102175).

According to an aspect of the present invention, an organic electroluminescent device including a substrate on which an anode layer; an organic structure including at least one light-emissive layer or at least one light-emissive unit having at least one light-emissive layer; a low resistance electron-transporting layer including a mixed layer of an electron-donating metal dopant and an organic compound; an organometallic complex-contained layer including an organometallic complex compound containing at least one metal ion selected from the group having an alkaline metal ion, an alkaline earth metal ion and a rare earth metal ion; a thermal reducing reaction generating layer; and a cathode layer, are laminated in that order. At least one of the anode layer and the cathode layer is transparent. The thermal reducing reaction generating layer is a layer produced by depositing on the organometallic complex-contained layer a thermally reducible metal capable of reducing a metal ion in the organometallic complex compound in a vacuum to the corresponding metal, followed by causing an oxidation-reduction (thermal reduction) reaction therebetween.

It is desirable for the reducing reaction generating layer to include a layer produced in an interface between the organometallic complex-contained layer and the cathode layer by depositing on the organometallic complex-contained layer a thermally reducible metal capable of reducing a metal ion in the organometallic complex compound in vacuum to the corresponding metal, followed by causing an oxidation-reduction reaction therebetween.

The cathode layer can be a metal having a work function of not less than 4.0 eV.

The cathode layer can be an electrically conducting compound.

It is desirable for the electron-donating metal dopant to have an ionization potential of less than 4.0 eV.

The electron-donating metal dopant can include at least one metal selected from the group having alkaline metals, alkaline earth metals and rare earth metals.

It is desirable for the electron-donating metal dopant and the organic compound to be mixed in a molar ratio of range from 1:10 to 10:1 in the low resistance electron-transporting layer.

It is desirable for the low resistance electron-transporting layer to have a resistivity of less than $1.0 \times 10^{10}$ $\Omega$cm.

It is desirable for the low resistance electron-transporting layer to have a resistivity of not less than $1.0 \times 10^{2}$ $\Omega$cm and less than $1.0 \times 10^{10}$ $\Omega$cm.

It is desirable for the organometallic complex-contained layer to be formed only from an organometallic complex compound containing at least one metal ion selected from the group having an alkaline metal ion, an alkaline earth metal ion and a rare earth metal ion.

It is desirable for the organic layer formed only from the organometallic complex compound to have a layer thickness of not more than 10 nm.

The organometallic complex-contained layer can include a mixed layer of an organometallic complex compound including at least one metal ion selected from the group having an alkaline metal ion, an alkaline earth metal ion and a rare earth metal ion, and at least one electron-transporting organic compound.

It is desirable for the organometallic complex compound and the electron-transporting organic compound to be mixed in a molar ratio of a range from 1:10 to 10:1 in the organometallic complex-contained layer.

It is desirable for the thermally reducible metal used in the formation of the reducing reaction generating layer to be the same as a metal used in the cathode layer.

The thermally reducible metal can include at least one metal selected from the group having aluminum, silicon, zirconium, titanium and tungsten.

It is desirable for the thermally reducible metal to be deposited as a layer via one of a resistive heating vapor deposition method, an electron beam vapor deposition method, and a laser beam vapor deposition method.

It is desirable for the cathode layer to be formed with one of a resistive heating vapor deposition method, an electron beam vapor deposition method, and a laser beam vapor deposition method.

It is desirable for the cathode layer to be formed as a layer with a sputtering method, and a sputtering apparatus used in the sputtering method is a facing target sputtering system which includes a pair of opposed targets disposed with a certain distance, a reflection electrode capable of reflecting electrons towards a front peripheral area of each target and a magnetic field generation medium capable of forming a parallel magnetic field in a neighborhood of the peripheral portion of each target, the magnetic field having a portion parallel to the peripheral portion of the target.

It is desirable for the thermally reducible metal and a metal used in the formation of the cathode layer each to have a work function of not less than 4.0 eV.

In another embodiment, a production method of an organic electroluminescent device is provided, including forming an anode layer on a substrate; forming an organic structure, including at least one light-emissive layer or at least one light-emissive unit having at least one light-emissive layer, on the anode layer; forming a low resistance electron-transporting layer, including a mixed layer of an electron-donating metal dopant and an organic compound, on the organic structure; forming an organometallic complex-contained layer, including an organometallic complex compound having at least one metal ion selected from the group having an alkaline metal ion, an alkaline earth metal ion and a rare earth metal ion, on the low resistance electron-transporting layer; forming a reducing reaction generating layer by vapor depositing a thermally reducible metal, capable of reducing a metal ion in the organometallic complex compound in a vacuum to a corresponding metal, on the organometallic complex-contained layer; and forming a cathode layer having one of a metal and electrically conducting compound having a work function of not less than 4.0 eV on the reducing reaction generating layer.

BRIEF DESCRIPTION OF THE DRAWINGS

FIG. 19 is a graph of the results of the resistivity determined in Test Example.

DESCRIPTION OF THE PREFERRED EMBODIMENTS

Figure 1:
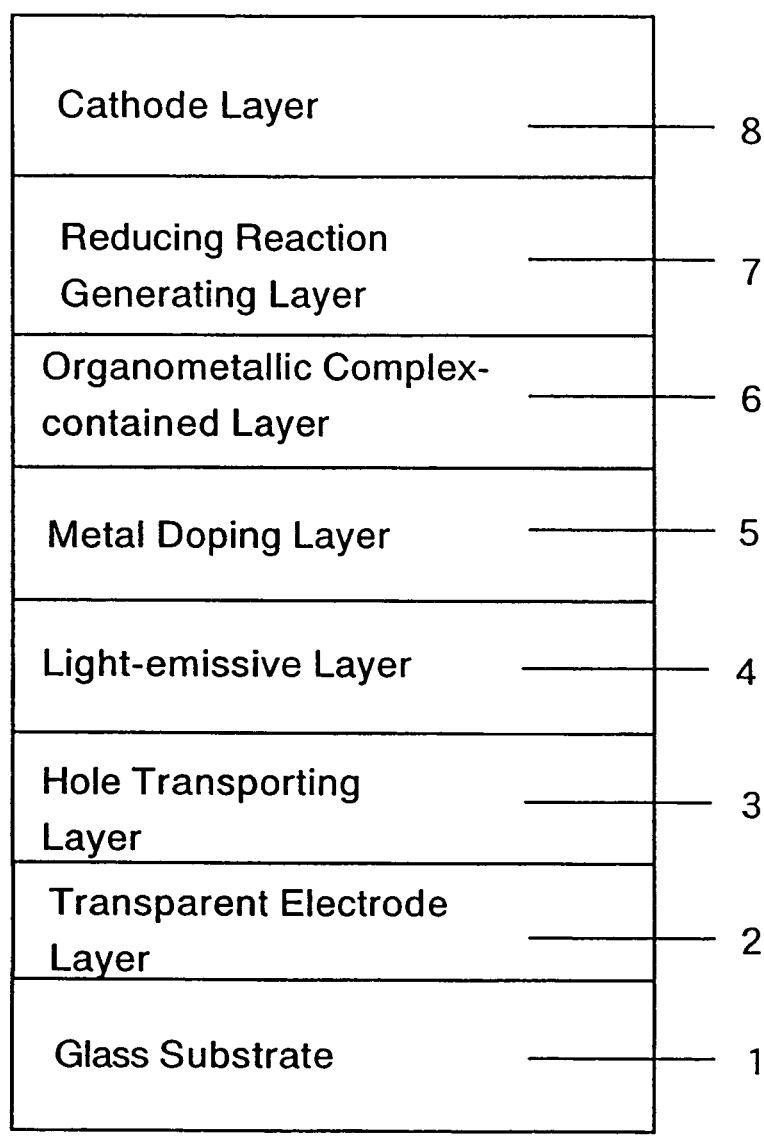
FIG. 1 is a schematic view showing the structure of the organic EL device according to an embodiment of the present invention.

FIG. 1 is a schematic view showing the structure of the organic EL device according to an embodiment of the present invention. A glass substrate (transparent substrate) 1 is provided thereon with a transparent electrode layer 2, a positive hole (hole) transporting layer 3 having an organic compound, a light-emissive layer 4 having an organic compound, a metal doping layer 5, an organometallic complex-contained layer 6, a reducing reaction generating layer 7, and a cathode layer (cathode) 8. Out of the elements (layers) which constitute the glass substrate 1, the transparent electrode layer 2 corresponds to an "anode layer" (anode), the hole transporting layer 3 and the light-emissive layer 4 correspond to an "organic structure having a light-emissive layer", and the metal doping layer 5 corresponds to a "low resistance electron-transporting layer". Furthermore, the "organic structure having a light-emissive layer" can include a hole injection layer and a hole blocking layer.

However, as is described in the following examples, when a thermally reducible metal having a thermal reduction property under a vacuum such as aluminum is used as a metal of the cathode layer 8, it is of course possible to form a reducing reaction generating layer 7 using a metal such as a thermally reducible metal, for example, aluminum, which is the same as the metal used in the formation of the cathode layer 8 and, in such a case, it is not necessary to separate these two layers (layer formation processes). Especially, among the thermally reducible metals, since aluminum is frequently used as a wiring material in the prior art semiconductor devices because of its low resistivity (about $2.45 \times 10^{-6}$ Ωcm) and has a high reflectance of 90% or more with respect to visible light, and these properties can be effectively utilized along with its good thermal reducibility, aluminum is the most useful metal in the formation of the reducing reaction generating layer 7 and the cathode layer 8 which are important elements which constitute the organic EL device of the present invention.

Alternatively, if it is desired to form a transparent cathode electrode using an electrode material such as ITO, and thus enable to emit light also from a side of the cathode layer 8, a reducing reaction generating layer 7 is formed as a light-transmissible layer and then a transparent electrode layer 2 is formed thereon. Such a layer property can be obtained by controlling an amount of the thermally reducible metal which consumed in the formation of the reducing reaction generating layer 7 to a necessary and minimum level.

The organic EL device which satisfies the above-described essential features suggested by the present invention can have different lamination structures, typical examples of which include: (1) anode layer/light-emissive layer/low resistance electron-transporting layer/metal complex-contained layer/reducing reaction generating layer/cathode layer; (2) anode layer/hole (positive hole) transporting layer/light-emissive layer/low resistance electron-transporting layer/metal complex-contained layer/reducing reaction generating layer/cathode layer; (3) anode layer/hole injection layer/light-emissive layer/low resistance electron-transporting layer/metal complex-contained layer/reducing reaction generating layer/cathode layer; (4) anode layer/hole injection layer/hole transporting layer/light-emissive layer/low resistance electron-transporting layer/metal complex-contained layer/reducing reaction generating layer/cathode layer; and (5) anode layer/hole injection layer/hole transporting layer/light-emissive layer/hole blocking layer/low resistance electron-transporting layer/metal complex-contained layer/reducing reaction generating layer/cathode layer.

Further, as is suggested by the inventors of the present invention in Japanese Patent Application No. 2002-86599 (Japanese Patent Application Laid-open No. 2003-272860), the organic EL device of the present invention can have a new lamination structure. Namely, according to this embodiment of the present invention, a whole body of the layers that used to be sandwiched by the cathode layer and the anode layer (in the conventional organic EL devices) is considered to be a "light-emissive unit" and two or more light-emissive units are partitioned with a charge generation layer as follows: "anode layer/light-emissive unit/charge generation layer/light-emissive unit/charge generation layer/ . . . /light-emissive unit/cathode layer". Furthermore, the organic EL device of the present invention can have any other lamination structure as long as the EL device has a combination of low resistance electron-transporting layer/metal complex-contained layer/reducing reaction generating layer in the portion adjacent to the cathode layer.

In the combination of low resistance electron-transporting layer/metal complex-contained layer/reducing reaction generating layer, an organic compound used in the formation of each layer, a metal doped (or mixed) in the low resistance electron-transporting layer or a thermally reducible metal used in the formation of the reducing reaction generating layer may be formed into a desired layer by using any one of the conventional layer formation methods. For example, a vapor deposition method and a sputtering method can be used as the layer formation method.

Further, the "metal doping layer" which is the low resistance electron-transporting layer can be formed using a co-deposition method described in Japanese Unexamined Patent Publication (Kokai) No. 10-270171, or can be formed by depositing a layer-forming metal at a very small thickness of less than 20 Å on the organic layer to be doped, thereby producing a in-situ doped organic layer having metal atoms dispersed therein as a result, as is described by the inventors of the present invention in the article, "IEEE Trans. Electron Devices, 40, 1342(1993)", cited above.

Furthermore, the thermally reducible metal such as aluminum and zirconium used in the reducing reaction generating layer and the cathode layer material can also be formed into a layer by using a vapor deposition method or a sputtering method. However, the layer formation method applied to these materials is not restricted to the above methods as long as this method is carried out under a vacuum.

When the present invention is applied in practice, the organic compound used as the organic electron-transporting compound of the low resistance electron-transporting layer and the metal complex compound used in the metal complex-contained layer are not restricted to specific compounds. Therefore, any organic compounds described in the above-cited Japanese patent publications such as Japanese Unexamined Patent Publication (Kokai) Nos. 10-270171, 11-251067, 11-233262, 2000-182774, 2001-244079, 2001-102175, and others, can be used without any specific limitation.

Furthermore, arylamine compounds used in the formation of the hole injection layer, the hole transporting layer and the hole transporting light-emissive layer are not restricted to the specific compounds, but preferably arylamine compounds disclosed in, for example, Japanese Unexamined Patent Publication (Kokai) Nos. 6-25659, 6-203963, 6-215874, 7-145116, 7-224012, 7-157473, 8-48656, 7-126226, 7-188130, 8-40995, 8-40996, 8-40997, 7-126225, 7-101911 and 7-97355 can be used.

Typical examples of suitable arylamine compounds include: N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino] p-terphenyl, 4,4'-bis[N-(2-naphtyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N- phenylamino]biphenyl, 4,4"-bis[N-(1-anthryl)-N-phenylamino] p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis {N-phenyl-N-[4-(1-naphthyl)phenyl]amino}biphenyl, 4,4'-bis[N-phenyl-N-(2-pyrenyl)amino]biphenyl, 2,6-bis[N,N-di(2-naphthyl)amino]fluorene, 4,4"-bis(N,N-di-p-tolylamino)terphenyl, bis(N-1-naphthyl)(N-2-naphthyl)amine, and the like. Moreover, any well-known arylamine compounds used in the production of the conventional organic EL devices can be suitably used.

Furthermore, in the formation of the hole injection layer, the hole transporting layer and the hole transporting light-emissive layer, a molecule-dispersed polymer dispersing therein the above-described organic compound or a polymerized product of the above-described organic compound can be used. Moreover, so-called π-conjugated polymers such as polyparaphenylenevinylene and derivatives thereof, hole-transporting non-conjugated polymers (typically poly(N-vinylcarbazole) and σ-conjugated polymers such as polysilanes) can be used.

The hole injection materials for the layer formed over the anode layer is not specifically restricted. However, metal phthalocyanines such as copper phthalocyanine and metal-free phthalocyanines, a carbon layer or coating, and electrically conducting polymers such as polyaniline can be suitably used in the formation of the hole injection layer. Furthermore, as is described by the inventors of the present invention in Japanese Unexamined Patent Publication (Kokai) Nos. 11-251067 (US counterpart: U.S. Pat. No. 6,423,429, B2) and 2001-244079 (corresponding U.S. Pat. No. 6,589,673B1), the hole injection layer can be formed by making the above-described arylamine compounds react with a Lewis acid molecule, as an oxidizing agent (in terms of Lewis acid chemistry), to form a radical cation of the arylamine compounds.

EXAMPLES

The present invention will be further described with reference to the working examples thereof. Note, however, that the present invention is not restricted to these working examples. Furthermore, for the comparison purpose with the working examples, reference examples will be also described with reference to the organic EL devices which have been already developed and disclosed by the inventors of the present invention.

In the following examples, the layer formation of the organic compound and the metal as well as the formation of the charge-generation layer were carried out by using a vapor deposition apparatus "VPC-400", product of Shinkuu Kikou Co., or a vapor deposition apparatus of Anelva Co., and an NFTS sputtering apparatus of FTS Corp. The control in the deposition rate of the vapor deposition material and in the thickness of the deposited layers were carried out by using a layer formation monitor with a quartz oscillator, attached to a vapor deposition apparatus "CRTM-8000", a product of ULVAC. Furthermore, to determine an actual layer thickness after the layer formation, a stylus step meter "P10" of Tencor Co, was used. The characteristics of the organic EL device were evaluated with a source meter "2400", a product of KEITHLEY, and the luminance meter "BM-8", a product of TOPCON. After production of the EL device, a DC voltage was stepwise applied at an increasing rate of 0.2 volts per 2 seconds or 1 volt per 2 seconds between the anode layer and the cathode layer of the device to determine the luminance and the electric current after a lapse of one second from the completion of each increase of the voltage. The EL spectrum was measured by using a optical multi-channel analyzer "PMA-11", a product of HAMAMATSU PHOTONICS, driven at a constant electric current.

Reference Example 1

Figure 2:
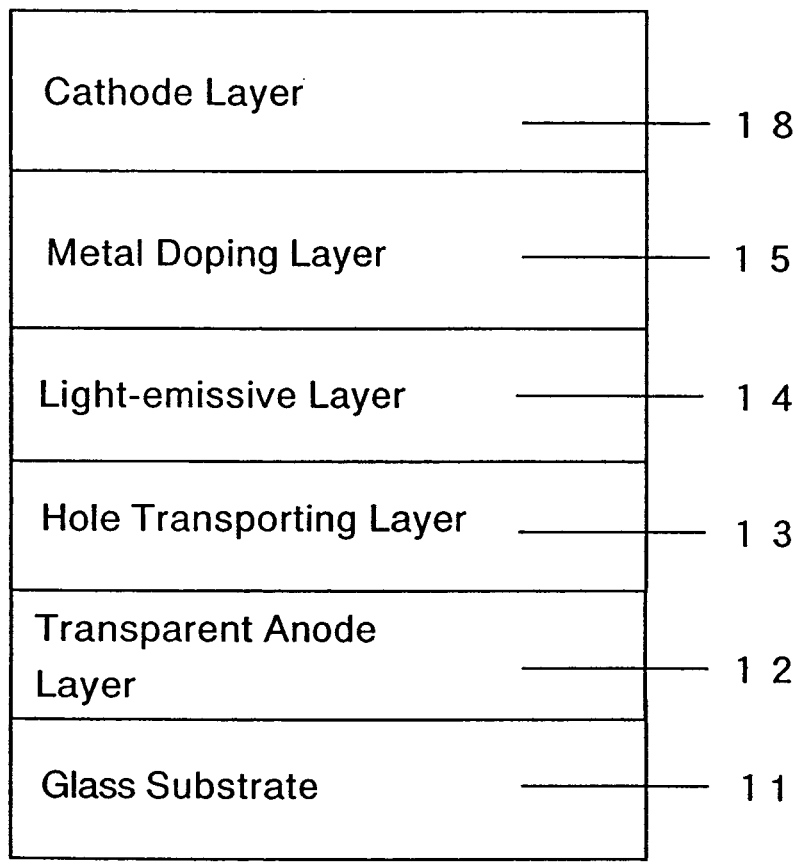
FIG. 2 is a schematic view showing the structure of the organic EL device used in Reference Example 1.

Reference Example 1 is intended to explain the production of the prior art organic EL device, described in Japanese Unexamined Patent Publication (Kokai) No. 10-270171, in which the low resistance electron-transporting layer (metal doping layer) is in contact with the cathode layer and can also act as an electron injection layer. The EL device produced in this reference example is the organic EL device having the lamination structure of FIG. 2, and it includes a glass substrate 11 having coated thereon an ITO (indium-tin oxide, product on Nippon Sheet Glass Co., Ltd.) having a sheet resistance of about 10 Ω/□ as a transparent anode electrode 12. Alpha(α)-NPD having a hole transporting property, represented by the following formula:

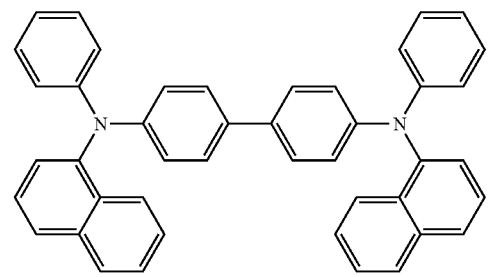

is deposited onto the ITO-coated glass substrate 11 under vacuum of about $10^{-6}$ Torr (1 Torr≈133.32 Pa) and at the deposition rate of about 2 Å/sec to form a hole transporting layer 13 having a thickness of about 500 Å. Next, an aluminum complex of tris(8-quinolinolato) (hereinafter, briefly referred to as "Alq") represented by the following formula:

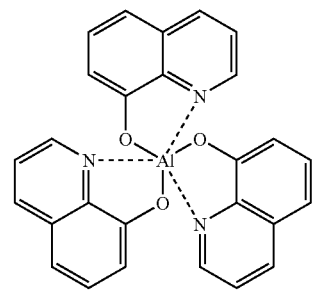

is deposited onto the hole transporting layer 13 under the same vacuum vapor deposition conditions as those applied to the formation of the hole transporting layer 13 to form a light-emissive layer 14 having a thickness of about 400 Å.

Thereafter, bathocuproine (hereinafter, briefly referred to as "BCP") represented by the following formula:

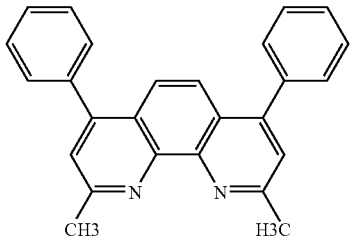 [SMILES: Cc1cc(-c2ccccc2)c2ccc3c(-c4ccccc4)cc(C)nc3c2n1]

and alkaline metal, cesium (Cs) are co-deposited in a molar ratio of BCP:Cs of about 4:1 under vacuum vapor deposition conditions to form a low resistance electron-transporting layer/electron injection layer (metal doping layer) 15 having a thickness of about 300 Å on the light-emissive layer 14. Following the formation of the metal doping layer 15, aluminum (Al) is deposited at the deposition rate of about 10 Å/sec to form a cathode layer 18 having a thickness of about 1,000 Å. The organic EL device having a square light-emitting area of 0.2 cm (length) by 0.2 cm (width) is thus obtained.

Figure 3:
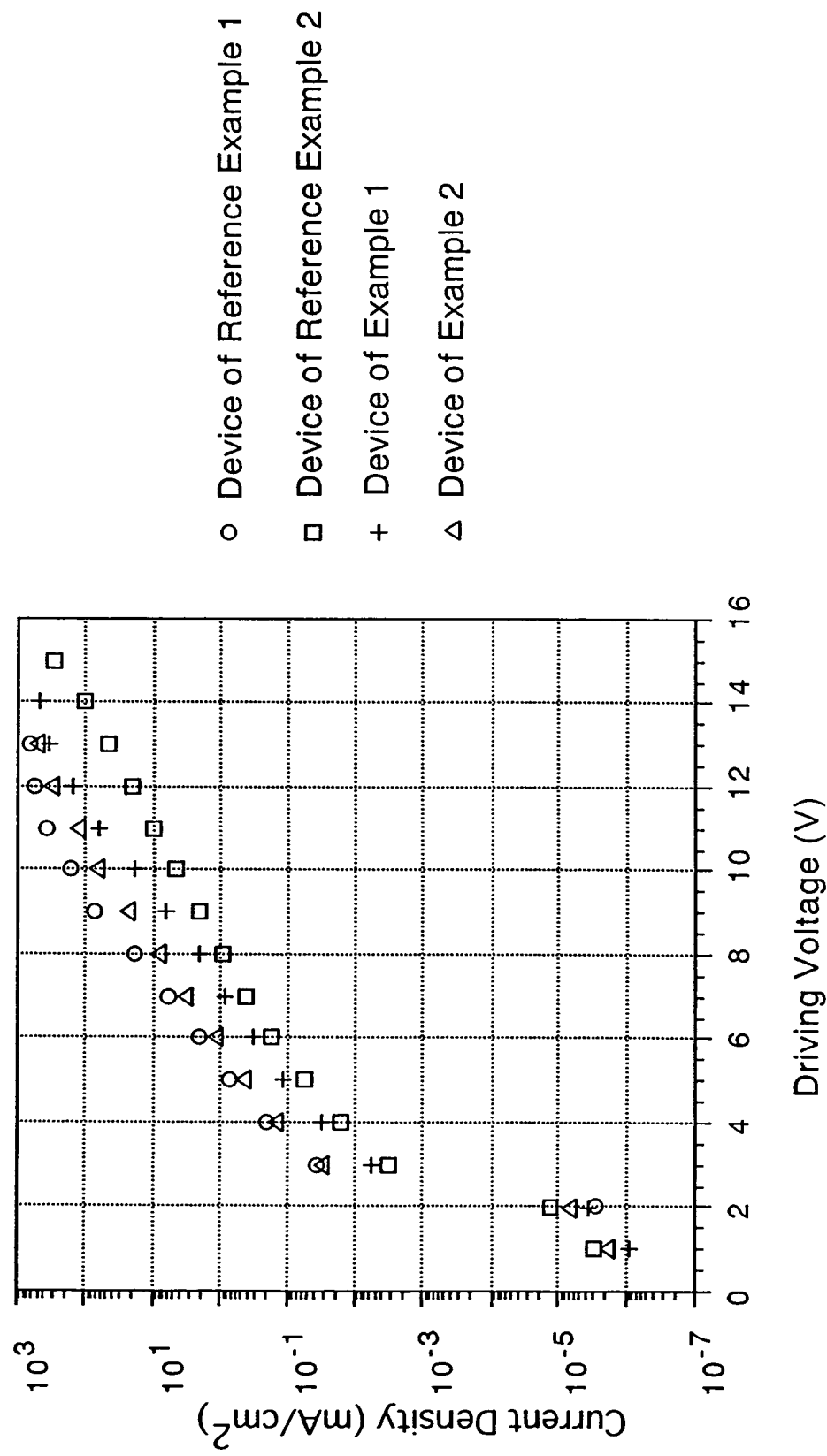
FIG. 3 is a graph showing a characteristic curve of a current density ($mA/cm^2$) to a driving voltage (V) with regard to the organic EL devices according to Reference Examples 1 and 2 and Examples 1 and 2.
Figure 4:
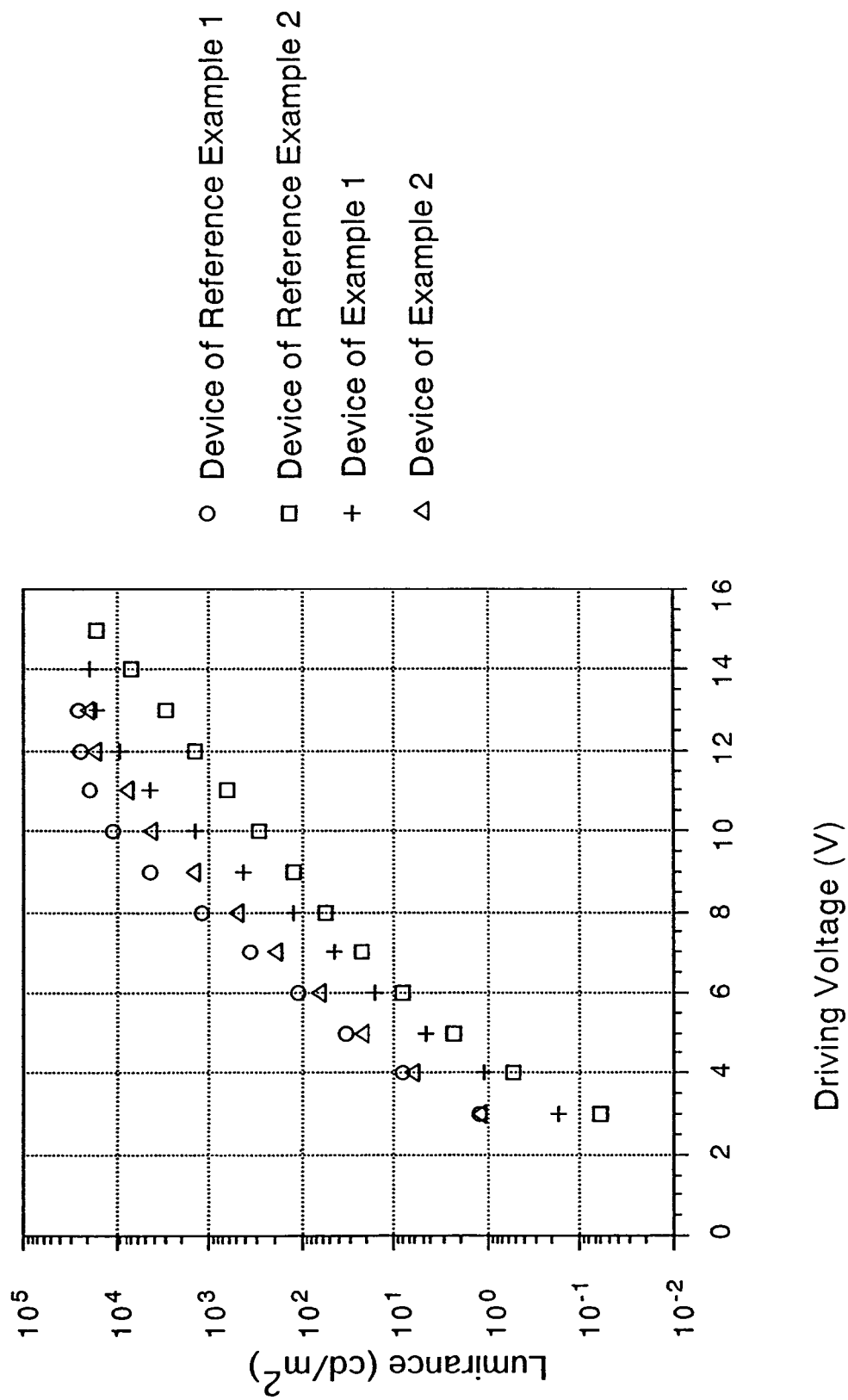
FIG. 4 is a graph showing a characteristic curve of a luminance ($cd/m^2$) to a driving voltage (V) with regard to the organic EL devices according to Reference Examples 1 and 2 and Examples 1 and 2.
Figure 5:
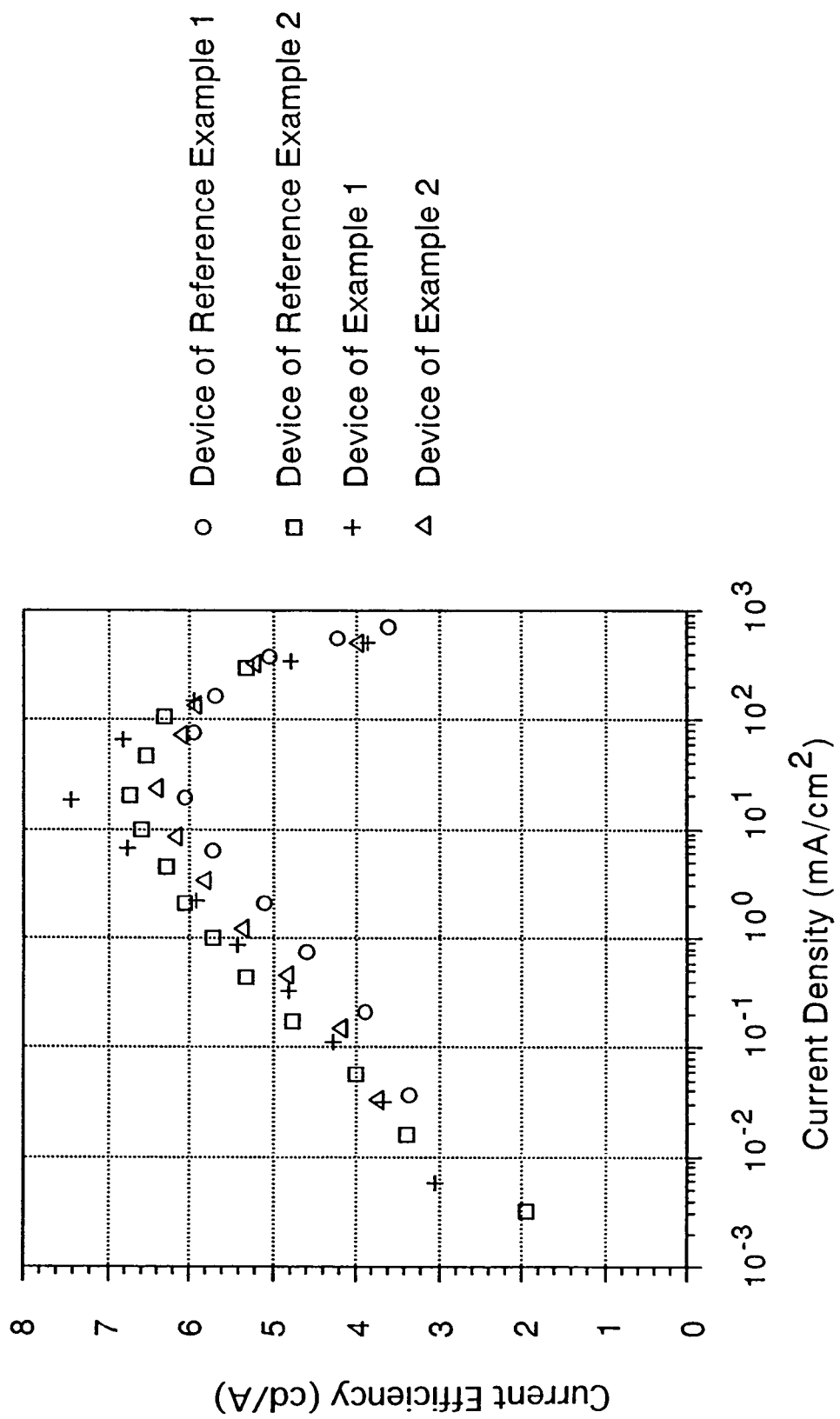
FIG. 5 is a graph showing a characteristic curve of a current efficiency (cd/A) to a current density ($mA/cm^2$) with regard to the organic EL devices according to Reference Examples 1 and 2 and Examples 1 and 2.
Figure 6:
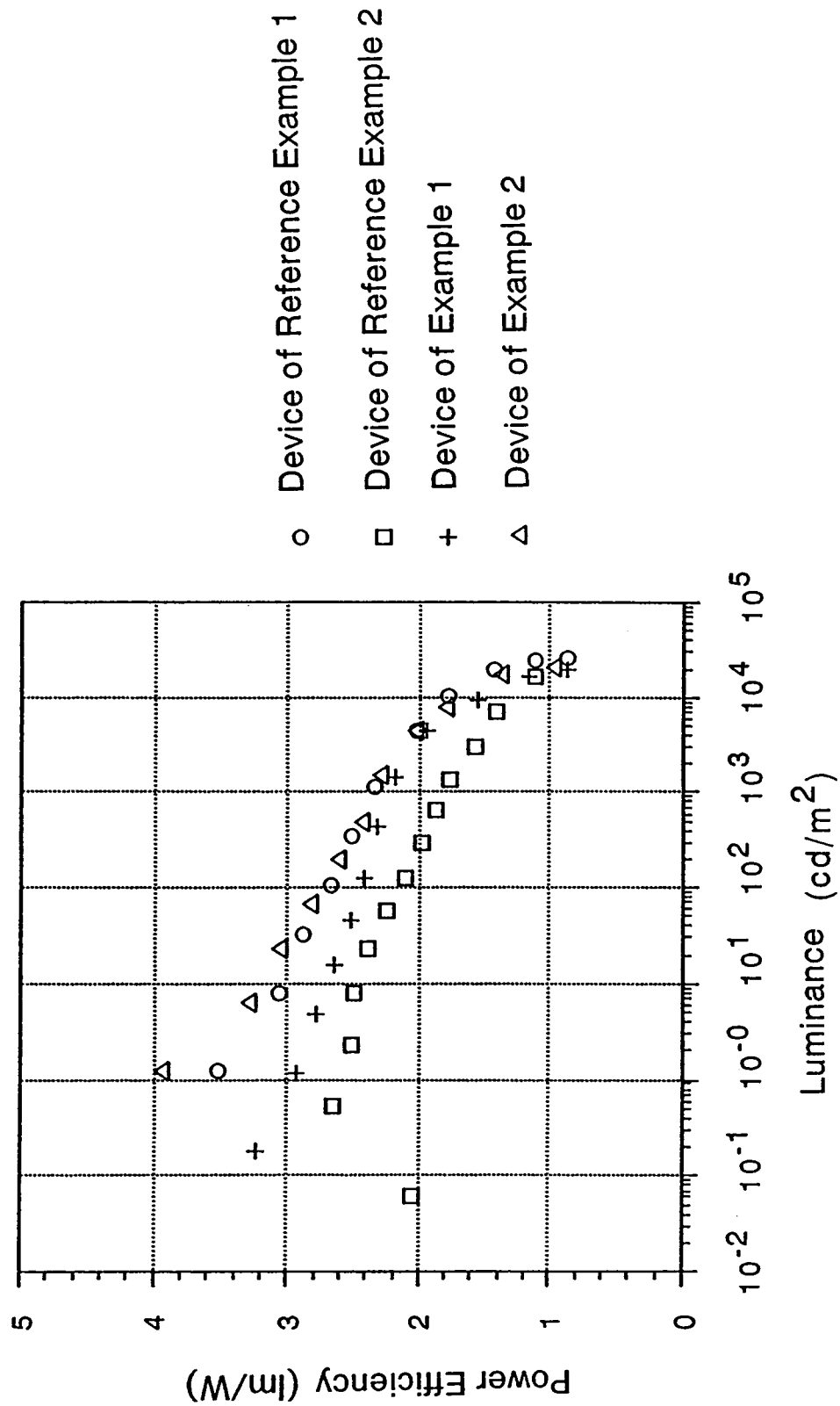
FIG. 6 is a graph showing a characteristic curve of a power efficiency (lm/W) to a luminance ($cd/m^2$) with regard to the organic EL devices according to Reference Examples 1 and 2 and Examples 1 and 2.

In the organic EL device of this reference example, a DC voltage was applied between the transparent anode electrode (ITO) 12 and the cathode electrode (Al) 16, and the luminance of the green light emitted from the light-emissive layer (Alq) 14 was measured. The results are plotted with white circle symbols (○), as shown in FIGS. 3 to 6, in which FIG. 3 represents a graph of current density (mA/cm$^2$)—voltage (v) characteristic curve of the EL device, FIG. 4 represents a graph of luminance (cd/m$^2$)—voltage (v) characteristic curve of the EL device, FIG. 5 represents a graph of current efficiency (cd/A)—current density (mA/cm$^2$) characteristic curve of the EL device and FIG. 6 represents a graph of power efficiency (lm/W)—luminance (cd/m$^2$) characteristic curve of the EL device. Note that FIGS. 3 to 6 each contains the results determined in the following examples (Reference Example 2, Examples 1 and 2) in addition to the results of this reference example).

Reference Example 2

Reference Example 2 is intended to explain the production of the prior art organic EL device, described in Japanese Unexamined Patent Publication (Kokai) No. 11-233262, in which the low resistance electron-transporting layer (metal doping layer) is omitted from the device and the reducing reaction generating layer (e) can act as an electron injection layer.

Figure 7:
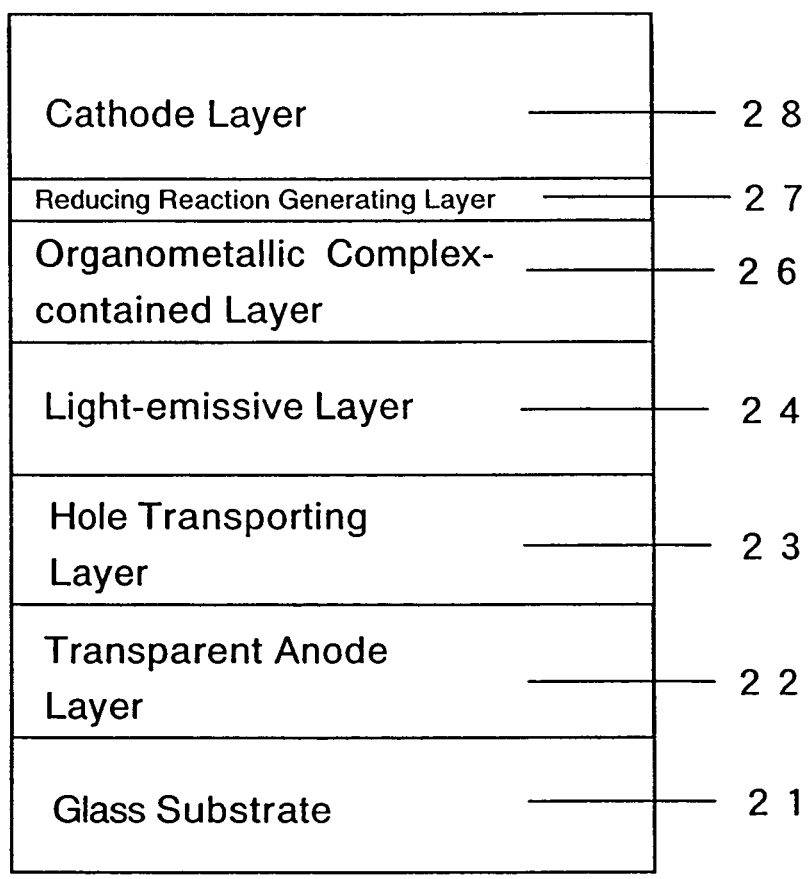
FIG. 7 is a schematic view showing the structure of the organic EL device used in Reference Example 2.

The EL device produced in this reference example is a organic EL device having the lamination structure of FIG. 7, in which a transparent anode electrode 22 and a hole transporting layer 23 are deposited on a glass substrate 21 under the same conditions as those applied in Reference Example 1. Subsequently, the above-described Alq is deposited to form a light-emissive layer 24 having a thickness of about 700 Å.

An organometallic complex compound containing lithium (alkaline metal) ions, i.e., mono(8-quinolinato) lithium complex (hereinafter, briefly referred to as "Liq") represented by the following formula:

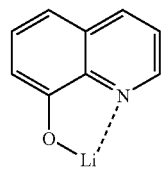

is deposited to form an organometallic complex-contained layer 26 having a thickness of about 10 Å. Thereafter, aluminum (Al) is deposited at the deposition rate of about 10 Å/sec to form a cathode layer 28 having a thickness of about 1,000 Å. In organic EL device thus obtained, a reducing reaction generating layer 27 is formed in an interface between the organometallic complex-contained layer 26 and the cathode layer 28 having Al. Furthermore, the EL device has the square light-emitting area of 0.2 cm (length) by 0.2 cm (width) as in that of the EL device of Reference Example 1.

In the organic EL device of this reference example, a DC voltage was applied to between the transparent anode electrode (ITO) 22 and the cathode electrode (Al) 28, and the luminance of the green light emitted from the light-emissive layer (Alq) 24 was measured. The results are plotted with white square symbols (□) in FIGS. 3 to 6.

Example 1

Figure 8:
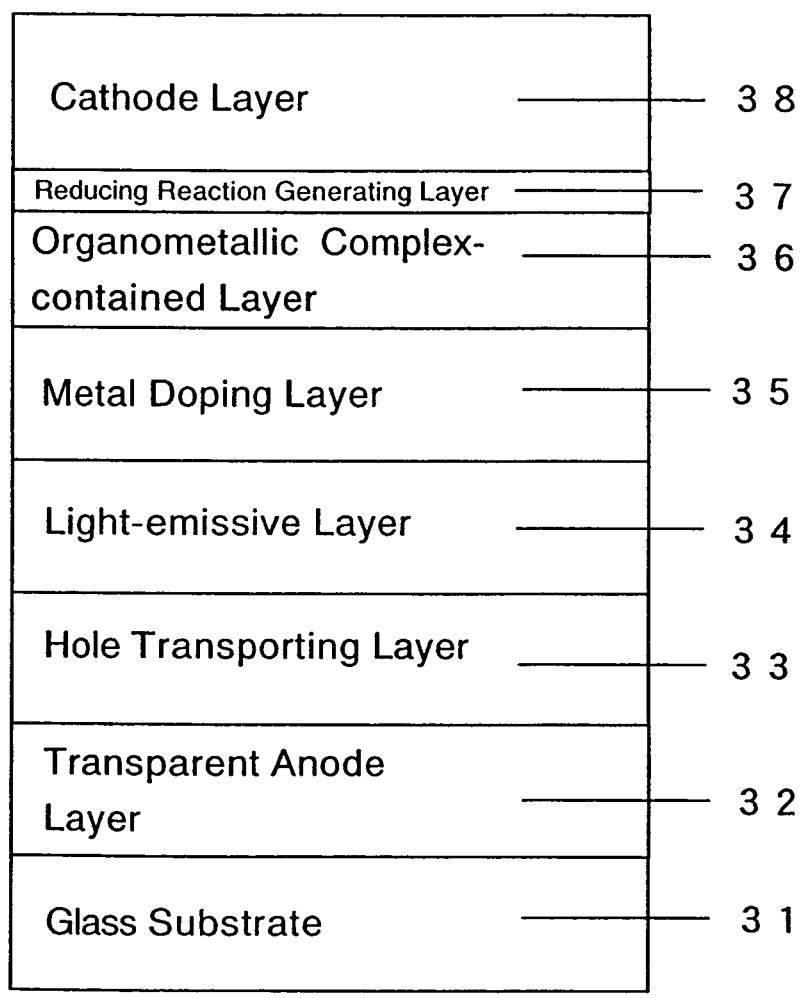
FIG. 8 is a schematic view showing the structure of the organic EL device used in Example 1.

Example 1 illustrates the production of the organic EL device, according to the present invention, in which the organometallic complex-contained layer is formed only from an organometallic complex. The organic EL device having the lamination structure of FIG. 8 is produced as follows. On a glass substrate 31, a transparent anode electrode 32, a hole transporting layer 33, a light-emissive layer 34 and a metal doping layer (low resistance electron-transporting layer, i.e., co-deposition layer of BCP and Cs) 35 are deposited in sequence under the deposition conditions similar to those applied in Reference Example 1. Thereafter, as in Reference Example 2, Liq is deposited to form an organometallic complex-contained layer 36 having a thickness of about 25 Å. Finally, an aluminum (Al; work function of 4.2 eV) which is a thermally reducible metal capable of reducing a metal ion (Li$^+$) in the Liq in a vacuum to the corresponding metal (Li) is deposited at a deposition rate of about 10 Å/sec to form a cathode layer 38 having a thickness of about 1,000 Å. During the deposition process, an oxidation-reduction reaction (thermal reducing reaction) is generated between the organometallic complex-contained layer 36 and the cathode layer 38 having Al to form a reducing reaction generating layer 37. The EL device thus obtained has the square light-emitting area of 0.2 cm (length) by 0.2 cm (width) as in that of the EL devices of Reference Examples 1 and 2.

In the organic EL device of this example, a DC voltage was applied to between the transparent anode electrode (ITO) 32 and the cathode electrode (Al) 38, and the luminance of the green light emitted from the light-emissive layer (Alq) 34 was measured. The results were plotted with plus symbols (+) in FIGS. 3 to 6.

Example 2

Figure 9:
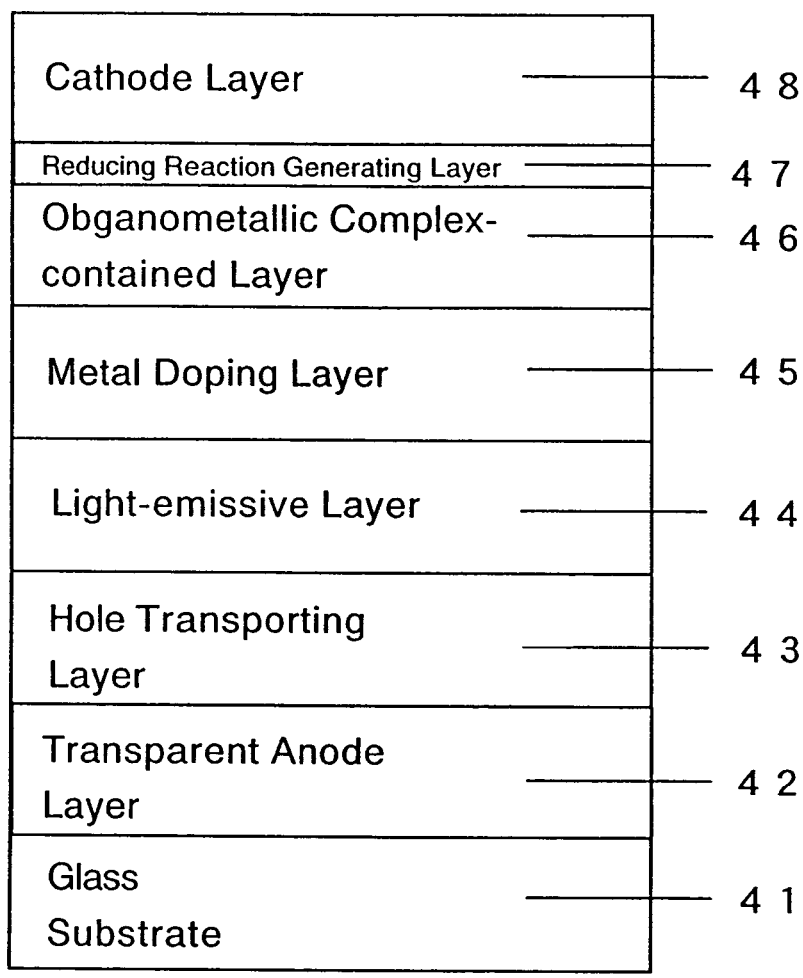
FIG. 9 is a schematic view showing the structure of the organic EL device used in Example 2.

Example 2 is intended to explain the production of the organic EL device according to the present invention in which the organometallic complex-contained layer is formed from a mixed layer of an organometallic complex compound and an electron-transporting organic compound. The organic EL device having the lamination structure of FIG. 9 is produced as follows. On a glass substrate 41, a transparent anode electrode 42, a hole transporting layer 43 and a light-emissive layer (Alq) 44 are deposited in sequence under the deposition conditions similar to those applied in Reference Example 1. Subsequently, a metal doping layer (low resistance electron-transporting layer) 45 is deposited as a co-deposition layer of BCP and Cs having a thickness of about 200 Å. Thereafter, an organometallic complex-contained layer 46 is formed from BCP and Liq in a molar ratio of 1:1 in accordance with the co-deposition method to form a mixed layer of BCP and Liq having a thickness of about 100 Å. Finally, an aluminum (Al) which is a thermally reducible metal capable of reducing a metal ion ($Li^+$) in the Liq in vacuum to the corresponding metal (Li) is deposited at the deposition rate of about 10 Å/sec to form a cathode layer 48 having a thickness of about 1,000 Å.

During the deposition process, an oxidation-reduction reaction (thermal reducing reaction) is generated between the organometallic complex-contained layer 46 and the cathode layer 48 having Al to form a reducing reaction generating layer 47. The EL device thus obtained has the square light-emitting area of 0.2 cm (length) by 0.2 cm (width) as in that of the EL devices of Reference Examples 1 and 2 and Example 1.

In the organic EL device of this example, a DC voltage was applied to between the transparent anode electrode (ITO) 42 and the cathode electrode (Al) 48, and the luminance of the green light emitted from the light-emissive layer (Alq) 44 was measured. The results are plotted with white triangle symbols (Δ) in FIGS. 3 to 6.

Note in Examples 1 and 2, described above, that silicon, zirconium, titanium or tungsten can be used as a thermally reducible metal in place of aluminum (Al), and that the deposition of Al or other metals can be carried out by using any one of a resistive heating vapor deposition method, an electron beam vapor deposition method and a laser beam vapor deposition method, and also that Al or other metals can be formed as a thin film by using a sputtering method in place of the vapor deposition method.

Example 3

Figure 10:
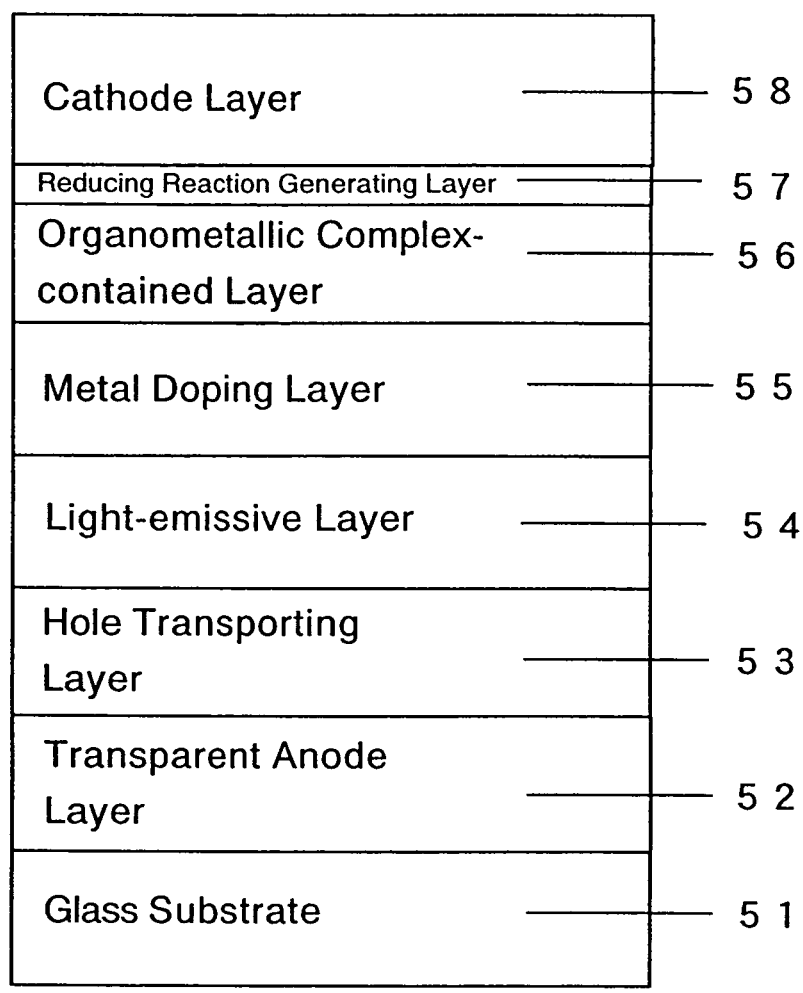
FIG. 10 is a schematic view showing the structure of the organic EL device used in Example 3.

Example 3 is intended to explain the production of the organic EL device according to the present invention in which the reducing reaction generating layer is formed from aluminum (Al) as a thermally reducible metal and the cathode layer is constituted from a ITO (transparent electrode). The organic EL device having the lamination structure of FIG. 10 is produced as follows. On a glass substrate 51, a transparent anode electrode 52, a hole transportation layer 53, a light-emissive layer 54, a metal doping layer 55 and an organometallic complex-contained layer (mixed layer) 56 are deposited in sequence under the deposition conditions similar to those applied in Example 2. Thereafter, Al (thermally reducible metal) is deposited in an amount sufficient to obtain a layer thickness of about 15 Å on the mixed layer 56 to cause a thermal reduction reaction, thereby forming a reducing reaction generating layer 57. Finally, a cathode layer 58 having a thickness of 1000 Å is formed from an electrically conducting compound (ITO) as a transparent cathode layer at the deposition rate of about 4 Å/sec by using the sputtering method suggested by the inventors of the present invention in Japanese Patent Application No. 2001-142672.

The sputtering apparatus used in this example is a facing target sputtering system. The sputtering system includes a pair of opposed targets disposed with a certain distance, and a reflection electrode capable of reflecting electrons towards a front peripheral area of each target is disposed in combination with the targets. Furthermore, a magnetic field generation medium is provided to form a parallel magnetic field in a neighborhood of the peripheral portion of each target. The magnetic field thus produced has a portion parallel to the peripheral portion of the target. Note that the ITO layer may be formed with a vapor deposition method in place of the sputtering method, and the vapor deposition method may be carried out by a resistive heating vapor deposition method, a electron beam vapor deposition method or a laser beam vapor deposition method.

Figure 11:
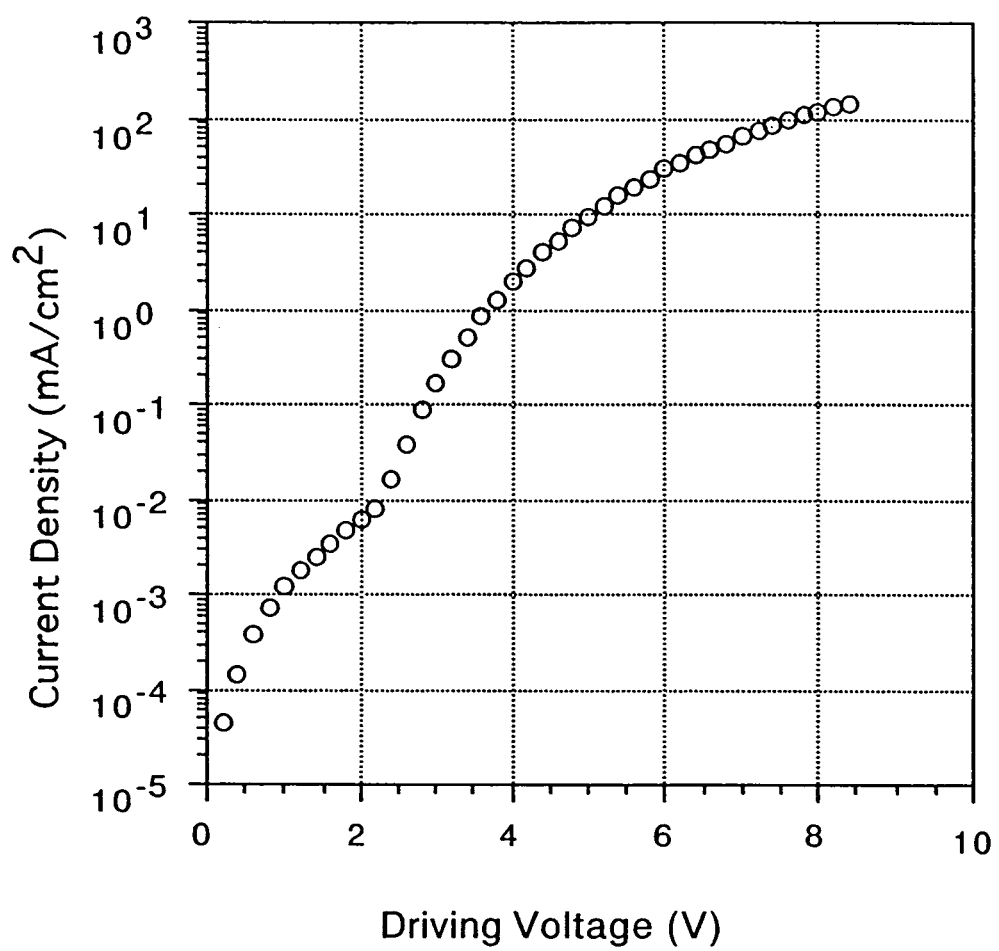
FIG. 11 is a graph showing a characteristic curve of a current density ($mA/cm^2$) to a driving voltage (V) with regard to the organic EL device according to Examples 3.
Figure 12:
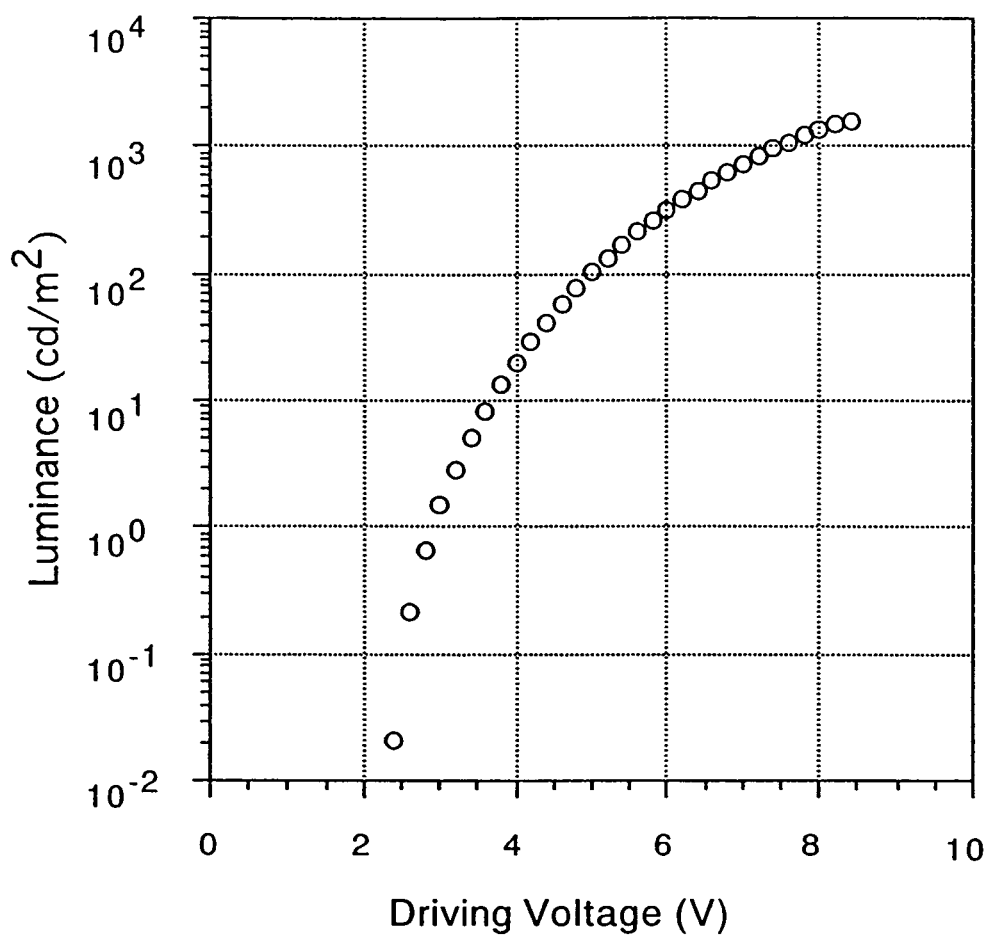
FIG. 12 is a graph showing a characteristic curve of a luminance ($cd/m^2$) to a driving voltage (V) with regard to the organic EL device according to Example 3.
Figure 13:
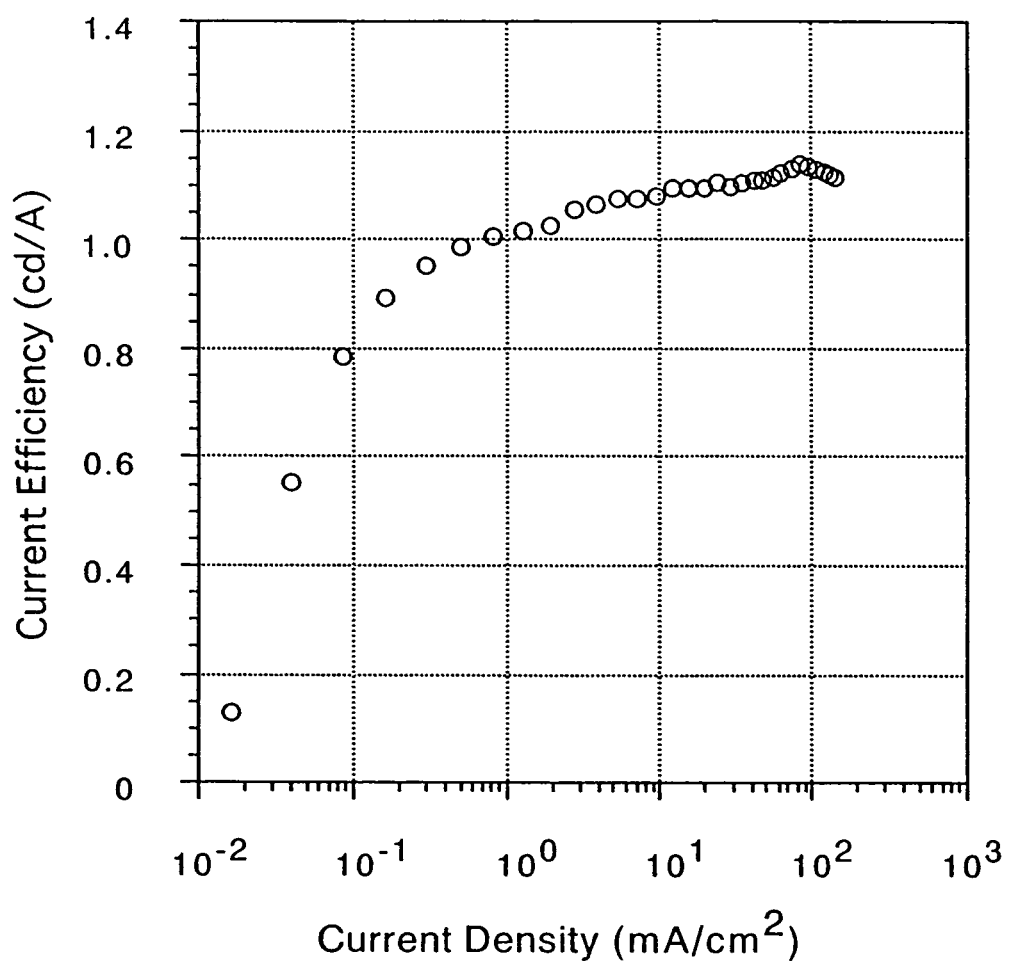
FIG. 13 is a graph showing a characteristic curve of a current efficiency (cd/A) to a current density ($mA/cm^2$) with regard to the organic EL device according to Example 3.
Figure 14:
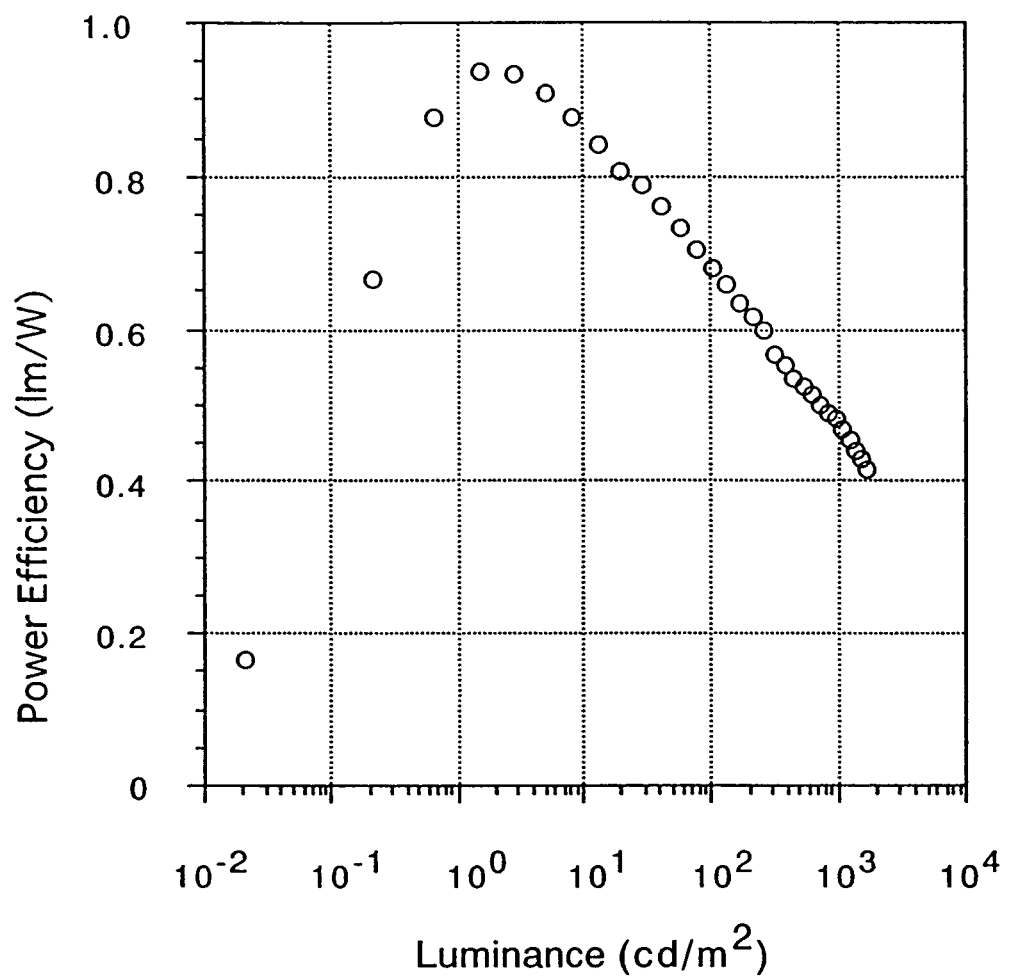
FIG. 14 is a graph showing a characteristic curve of a power efficiency (lm/V) to a luminance ($cd/m^2$) with regard to the organic EL device according to Example 3.

In the organic EL device of this example, a DC voltage was applied between the transparent anode electrode (ITO) 52 and the transparent cathode electrode (ITO) 58, and the luminance of the green light emitted from the light-emissive layer (Alq) 54 was measured. The results were plotted with white circle symbols (○) in FIGS. 11 to 14, in which FIG. 11 represents a graph of current density ($mA/cm^2$)—voltage (v) characteristic curve of the device, FIG. 12 represents a graph of luminance ($cd/m^2$)—voltage (v) characteristic curve of the device, FIG. 13 represents a graph of current efficiency (cd/A)—current density ($mA/cm^2$) characteristic curve of the device and FIG. 14 represents a graph of power efficiency (lm/W)—and luminance ($cd/m^2$) characteristic curve of the device. In this EL device, it was found that the turn-on voltage determined at the start of light emission is 2.4 volts, and if the reducing reaction generating layer of the present invention is disposed as a layer adjacent to the cathode layer, an energy barrier during electron injection can be reduced to a level of substantially zero (0), even if the cathode layer is formed from an electrode material having a large work function of about 5.0 eV such as ITO.

Test Example

In this test example, the resistivity (Ωcm) of the low resistance electron-transporting layer and others is measured for the reference. The measuring is carried out with two different methods depending on the values (range) of the resistivity of the test samples.

Figure 15:
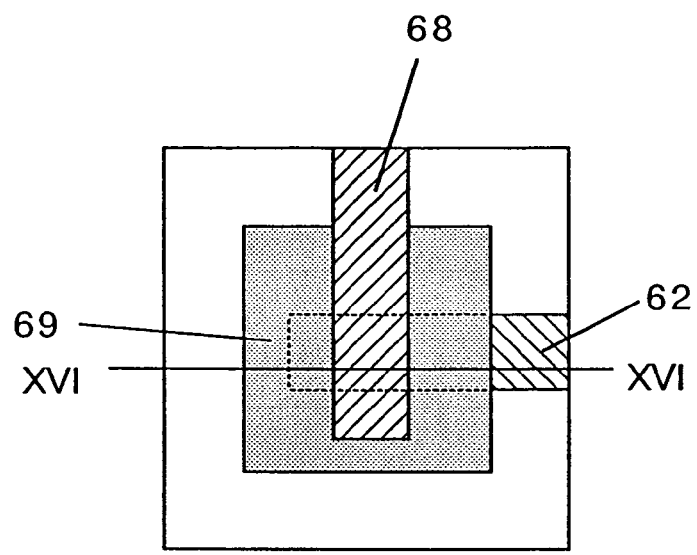
FIG. 15 is a plan view showing a device having a sandwiched structure used in the evaluation of the resistivity.
Figure 16:
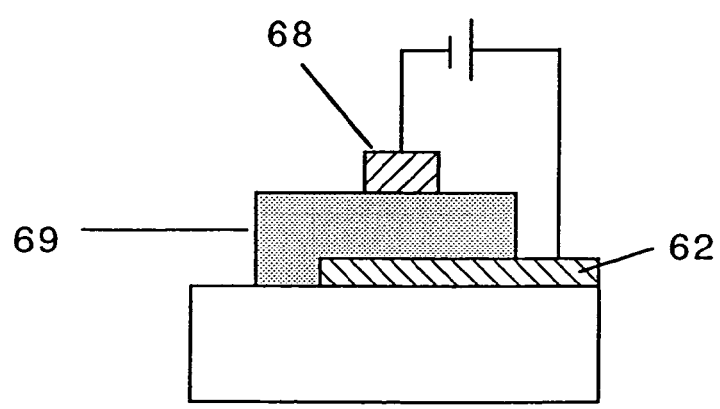
FIG. 16 is a cross-sectional view taken along line XVI-XVI of the device of FIG. 15.

The first measuring method can be suitably applied to the test samples having a relatively large resistivity, and the measurement process is carried out by sandwiching a vapor deposition layer by electrodes (sandwich method; a resistivity evaluation device having a sandwich structure shown in FIGS. 15 and 16). Using this method, the resistivity of the test sample is calculated from a ratio of the electric field E (V/cm), obtained from an applied voltage (V) and a layer thickness (cm) of the deposition layer of the sample, i.e., distance between the electrodes, and a current density ($A/cm^2$) obtained from a measured current value (A) and a cross-sectional area ($cm^2$) of the current flowing region. In other words, the resistivity is calculated from the following formula:

$$(\Omega cm) = (V/cm)/(A/cm^2).$$

The resistivity evaluation device used in this test example is produced by depositing a test sample (a resistivity of which material is measured) 69 at a desired thickness on an ITO (or Al) electrode 62 having a width of about 2 mm. Finally, an aluminum electrode 68 having a width of about 2 mm is deposited in such a manner that it is crossed with the ITO electrode 62.

Figure 17:
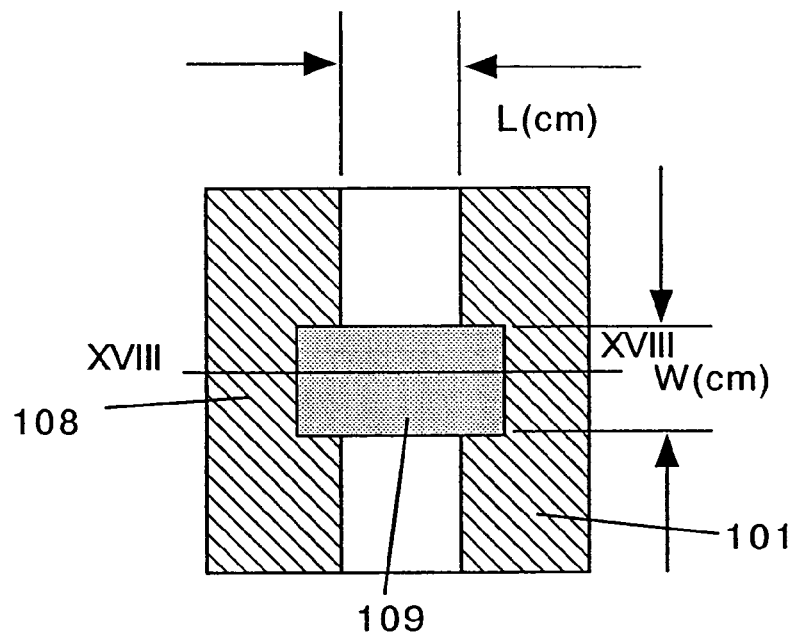
FIG. 17 is a plan view showing a device having a co-planar arrangement structure used in the evaluation of the resistivity.
Figure 18:
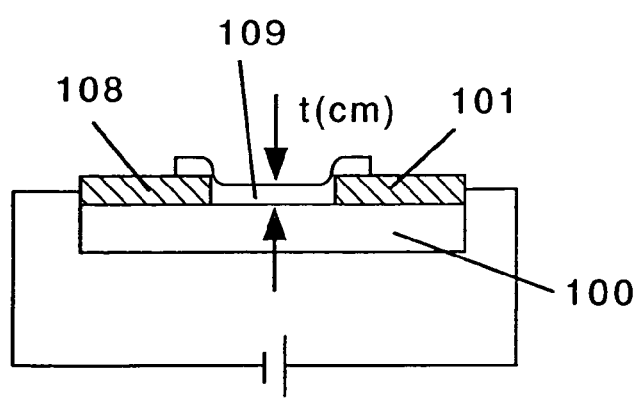
FIG. 18 is a cross-sectional view taken along line XVIII-XVIII of the device of FIG. 17.

The second measuring method can be suitably applied to the test samples having a relatively small resistivity, and the measurement process is carried out by using a resistivity evaluation device having a co-planar arrangement structure (co-planar arrangement method). In other words, as shown in FIGS. 17 and 18, a substrate 100 having electrodes deposited as layers on the same plane surface thereof which are used as an anode layer 101 and a cathode layer 108 are previously prepared. The anode layer 101 and the cathode layer 108 are disposed at a predetermined distance of L (cm). Thereafter, a test sample material is deposited, through a metal mask for defining a deposition area and having an opening with the certain width W (cm), on the electrodes-bearing substrate 100 to form a deposited layer 109 of the test sample having a predetermined thickness t (cm). In this method, an electric field E(V/cm) of the test sample is calculated by dividing an applied voltage (V) with a distance L (cm) between the electrodes, and a current density ($A/cm^2$) is calculated by dividing a measured current value (A) by a cross-sectional area of the current flowing region [in this example, W×t ($cm^2$)]. Using the calculated values, the resistivity (Ωcm) of the test sample can be calculated from the equation described above with regard to the first measuring method (sandwich method).

The test samples used herein are ITO (transparent electrode material), a co-deposition layer of Cs and BCP [Cs:BCP=1:1 (molar ratio); a low resistance electron-transporting layer of the present invention], a co-deposition layer of Li and Alq [Li:Alq=1:1 (molar ratio); a low resistance electron-transporting layer of the present invention], α-NPD (hole-transporting arylamine compound) and $Alq_3$ (light-emitting material). For the ITO, the resistivity is measured using the measuring device having a co-planar arrangement structure, and for the co-deposition layer of Cs and BCP, α-NPD and $Alq_3$, the resistivity is measured using the measuring device having a sandwich structure.

FIG. 19 is a graph showing the measurement results of the resistivity. In this graph, the symbols ○, —, |, □ and Δ each represents the measurement results obtained when the test sample is ITO, ITO/Cs:BCP/Al, Al/Li: $Alq_3$/Al, Al/$Alq_3$/Al, or ITO/α-NPD/Al.

The following is the resistivity of each test sample observed from the graph of FIG. 19.

ITO (symbol ○ of FIG. 19):
  $4×10^{-4}$ Ωcm (co-planar arrangement method);
ITO/Cs:BCP/Al (symbol — of FIG. 19):
  $2×10^5$ Ωcm (sandwich method);
Al/Li: $Alq_3$/AL (symbol | of FIG. 19):
  $2×10^9$ Ωcm (sandwich method);
Al/$Alq_3$/Al (symbol □ of FIG. 19):
  $6×10^{13}$ Ωcm (sandwich method); and
ITO/α-NPD/Al (symbol Δ of FIG. 19):
  $1×10^{13}$ Ωcm (sandwich method).

As is shown in FIG. 19, the metal doping layers (symbols | and —) used as a low resistance electron-transporting layer of the present invention can exhibit a property of the ohmic current in which an electric field is proportional to an electric current (current density), and their resistivities are within the range of not less than $1×10^2$ Ωcm and not more than $1×10^{10}$ Ωcm. On the other hand, with regard to pure organic compounds such as α-NPD (symbol Δ) and $Alq_3$ (symbol □), since their resistivities cannot be defined because of there being no proportional relationship between the electric field and the electric current, the resistivities are determined at an initial stage at which the electric current is observed.

Comparing the results of Reference Example 1 with those of Reference Example 2, the organic EL device of Reference Example 1 can be operated at a relatively low driving voltage, whereas the organic EL device of Reference Example 2 can exhibit a higher current efficiency (quantum efficiency). In Examples 1 and 2, the results can be maintained at a substantially equivalent level to the higher current efficiency (quantum efficiency) of Reference Example 2, and the low voltage driving characteristics of Examples 1 and 2 are comparable to that of Reference Example 1. Accordingly, it is appreciated that the organic EL devices of the present invention can simultaneously exhibit the property of the electron injection layer and the property of the electron transporting layer, both of which have been hitherto studied and disclosed by the inventors of the present invention. Furthermore, since it is well-known to a person skilled in the art that the driving durability of organic EL devices are substantially inversely proportional to the current density of the organic EL devices, the organic EL devices of the present invention can of course ensure a long driving durability because of their high current efficiency (quantum efficiency).

As can be appreciated from the above detailed description of the present invention, according to the present invention, an energy barrier during electron injection from a cathode can be diminished by using, in combination, different types of the electron injection layers and the electron transporting layers, both of which have been hitherto zealously studied and used by the inventors of the present invention. Furthermore, since the low resistance electron-transporting layer for reducing an electrical resistance is separated through the reducing reaction generating layer from the cathode metal layer, highly reactive metals such as alkaline metals can be substantially in the state of cations (oxidization state) in the low resistance electron-transporting layer as the result, and therefore, even if cheap and chemically stable metals such as aluminum which has been conventionally used as the low resistance wiring material are used as the thermally reducible metal, a low driving voltage can be realized in the organic EL devices, along with extension of the driving durability and the storage durability. Accordingly, the organic EL devices can be effectively utilized as a display device and a light source.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An organic electroluminescent device consisting of the following, in order:
  a transparent substrate;
  a transparent anode layer;
  a hole transportation layer consisting of an arylamine;
  an organic structure consisting of at least one light-emissive layer or at least one light-emissive unit having at least one light-emissive layer;
  a low resistance electron-transporting layer consisting of cesium and an organic compound;
  an organometallic complex-containing layer including an organometallic complex compound containing at least one metal ion selected from the group consisting of an alkali metal ion, an alkaline earth metal ion and a rare earth metal ion;
  a reducing reaction generating layer; and
  a transparent cathode layer
  wherein the reducing reaction generating layer is a layer produced by depositing aluminum on the organometallic complex-containing layer, thereby causing an oxidation-reduction reaction therebetween; and wherein the cathode consists of ITO.

2. The organic electroluminescent device according to claim 1, wherein the cesium and the organic compound are mixed in a molar ratio range of from 1:10 to 10:1 in the low resistance electron-transporting layer.

3. The organic electroluminescent device according to claim 1 wherein the low resistance electron-transporting layer has a resistivity of not less than $1.0 \times 10^2$ Ωcm and less than $1.0 \times 10^{10}$ Ωcm.

4. The organic electroluminescent device according to claim 1, wherein the organometallic complex containing layer consists of Liq and bathocuproine in a molar ratio of a range from 1:10 to 10:1.

5. The organic electroluminescent device according to claim 1, wherein the aluminum is deposited as a layer via one of a resistive heating vapor deposition method, an electron beam vapor deposition method, and a laser beam vapor deposition method.

6. The organic electroluminescent device according to claim 1, wherein the transparent cathode layer is formed with one of a resistive heating vapor deposition method, an electron beam vapor deposition method, and a laser beam vapor deposition method.

7. The organic electroluminescent device according to claim 1, wherein the transparent cathode layer is formed as a layer with a sputtering method, and a sputtering apparatus used in the sputtering method is a facing target sputtering system which includes a pair of opposed targets disposed with a certain distance, a reflection electrode capable of reflecting electrons towards a front peripheral area of each target and a magnetic field generation medium capable of forming a parallel magnetic field in a neighborhood of the peripheral portion of each target, the magnetic field having a portion parallel to the peripheral portion of the target.

8. A production method of an organic electroluminescent device having an anode layer, consisting of the following steps, in order:
    forming a hole transportation layer consisting of an arylamine, on the anode layer;
    forming an organic structure, consisting of at least one light-emissive layer or at least one light-emissive unit having at least one light-emissive layer, on the hole transportation layer;
    forming a low resistance electron-transporting layer consisting of a mixed layer of bathocuproine and cesium on the organic structure, by co-deposition of bathocuproine and cesium on the organic structure;
    forming an organometallic complex-containing layer wherein the organometallic complex consists of Liq, by co-deposition of bathocuproine and Liq or by deposition of Liq, to form a layer having a thickness of about one hundred (100) angstrom;
    forming a reducing reaction generating layer by vapor depositing aluminum on the organometallic complex-containing layer thereby causing an oxidation-reduction reaction between the aluminum and the lithium; and
    forming a cathode layer on the reducing reaction generating layer,
    wherein both of the anode layer and the cathode layer are transparent layers;
    and wherein the cathode consists of ITO.

9. The organic electroluminescent device of claim 1 wherein the low resistance electron-transporting layer is formed by co-deposition of bathocuproine and cesium in a molar ratio of bathocuproine:cesium of about 4:1 up to a thickness of about 300 Å.

10. A production method of an organic electroluminescent device having a transparent anode layer, comprising:
    forming adjacent the anode layer a hole transportation layer consisting of an arylamine;
    forming adjacent the hole transportation layer an organic structure consisting of at least one light-emissive layer or at least one light-emissive unit having at least one light-emissive layer;
    forming adjacent the organic structure, by co-deposition of bathocuproine and cesium in a molar ratio of bathocuproine:cesium of about 4:1 up to a thickness of about 300 Å, a low resistance electron-transporting layer arranged to also function as an electron injection layer;
    forming adjacent the low resistance electron-transporting layer an organometallic complex-containing layer including an organometallic complex compound containing at least one metal ion selected from the group consisting of an alkali metal ion, an alkaline earth metal ion and a rare earth metal ion;
    forming adjacent the organometallic complex-containing layer a reducing reaction generating layer; and
    forming a transparent cathode layer on the reducing reaction generating layer;
    wherein
    the reducing reaction generating layer is formed from an oxidation-reduction reaction caused by depositing aluminum on said organometallic complex-containing layer and
    the cathode layer is formed by depositing an electrically conducting compound onto the reducing reaction generating layer, using a sputtering method and
    wherein the cathode consists of ITO.

11. The organic electroluminescent device according to claim 1, wherein the reducing reaction generating layer is a light transmissive layer.

12. The organic electroluminescent device according to claim 1 wherein the organic structure consisting of at least one light-emissive layer or at least one light-emissive unit having a least one light-emissive layer consists of an $Alq_3$ light-emissive layer.

13. The organic electroluminescent device according to claim 1 consisting of the following, in order:
    a transparent substrate;
    a transparent anode layer;
    an alpha-NPD hole transporting layer;
    an $Alq_3$ light-emissive layer;
    a BCP/Cs low resistance electron-transporting layer;
    a BCP/Liq organometallic complex-containing layer;
    a reducing reaction generating layer; and
    an ITO cathode,
    wherein the reducing reaction generating layer is produced by depositing aluminum on the organometallic complex-containing layer, thereby causing an oxidation-reduction reaction between the aluminum and the lithium ions of Liq of the organometallic complex-containing layer.

14. The production method of claim 10 which consists of:
    forming adjacent the anode layer an alpha-NPD hole transporting layer,
    forming adjacent the hole transporting layer an $Alq_3$ light-emissive layer,
    forming adjacent the light-emissive layer, by co-deposition of bathocuproine and cesium in a molar ratio of bathocuproine:cesium of about 4:1 up to a thickness of about 300 Å, a low resistance electron-transporting layer,
    forming adjacent the low resistance electron-transporting layer a BCP/Liq organometallic complex-containing layer,
    forming adjacent the organometallic complex-containing layer, a reducing reaction generating layer; and forming adjacent the reducing reaction generating layer an ITO cathode, wherein the reducing reaction generating layer is produced by depositing aluminum on the organometallic complex-containing layer, thereby causing an oxidation-reduction reaction between the aluminum and the lithium ions of Liq of the organometallic complex-containing layer.

* * * * *